United States Patent
Swager et al.

(10) Patent No.: US 10,236,450 B2
(45) Date of Patent: Mar. 19, 2019

(54) ORGANIC CONDUCTIVE MATERIALS AND DEVICES

(71) Applicant: Massachusetts Institute of Technology, Cambridge, MA (US)

(72) Inventors: Timothy M. Swager, Newton, MA (US); Troy Andrew Van Voorhis, Cambridge, MA (US); Marc A. Baldo, Lexington, MA (US); Tony Wu, Cambridge, MA (US); Katsuaki Kawasumi, Brookline, MA (US); Tianyu Zhu, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 18 days.

(21) Appl. No.: 15/078,817

(22) Filed: Mar. 23, 2016

(65) Prior Publication Data
US 2016/0285007 A1    Sep. 29, 2016

Related U.S. Application Data

(60) Provisional application No. 62/137,714, filed on Mar. 24, 2015.

(51) Int. Cl.
*C09K 11/02* (2006.01)
*C09K 11/06* (2006.01)
*H01L 51/00* (2006.01)

(52) U.S. Cl.
CPC ........ *H01L 51/0071* (2013.01); *C09K 11/025* (2013.01); *C09K 11/06* (2013.01); *H01L 51/0061* (2013.01); *C09K 2211/1014* (2013.01); *C09K 2211/1022* (2013.01); *C09K 2211/1051* (2013.01); *C09K 2211/1074* (2013.01); *Y02E 10/549* (2013.01)

(58) Field of Classification Search
CPC ..... C07C 13/64; C07C 35/44; C07C 2603/90; C07F 9/65683; Y10S 428/917
See application file for complete search history.

(56) References Cited

U.S. PATENT DOCUMENTS

| 4,885,211 A | 12/1989 | Tang et al. |
| 5,059,861 A | 10/1991 | Littman et al. |

(Continued)

FOREIGN PATENT DOCUMENTS

| EP | 1076368 A2 | 2/2001 | |
| JP | 2005-041789 | * 7/2003 | ............ H01L 51/50 |

(Continued)

OTHER PUBLICATIONS

Chou et al., Triptycene derivatives as high-Tg host materials for various electrophosphorescent devices. J Mater Chem. Jan. 12, 2010;20(4):798-805. Epub Dec. 1, 2009.

(Continued)

*Primary Examiner* — Shane Fang
(74) *Attorney, Agent, or Firm* — Wolf, Greenfield & Sacks, P.C.

(57) ABSTRACT

Embodiments described herein relate to compositions including bridged bicyclic compounds such as iptycene-based structures and extended iptycene structures. In some embodiments, the compositions may be useful in organic light-emitting diodes (OLEDs), organic photovoltaics, and other devices.

16 Claims, 18 Drawing Sheets

(56) References Cited

U.S. PATENT DOCUMENTS

| | | |
|---|---|---|
| 5,059,862 A | 10/1991 | Littman et al. |
| 5,247,190 A | 9/1993 | Friend et al. |
| 5,608,287 A | 3/1997 | Hung et al. |
| 5,677,572 A | 10/1997 | Hung et al. |
| 5,703,436 A | 12/1997 | Forrest et al. |
| 5,714,838 A | 2/1998 | Haight et al. |
| 5,739,545 A | 4/1998 | Guha et al. |
| 5,776,622 A | 7/1998 | Hung et al. |
| 5,776,623 A | 7/1998 | Hung et al. |
| 5,837,391 A | 11/1998 | Utsugi |
| 5,969,474 A | 10/1999 | Arai |
| 5,981,306 A | 11/1999 | Burrows et al. |
| 6,137,223 A | 10/2000 | Hung et al. |
| 6,140,763 A | 10/2000 | Hung et al. |
| 6,172,459 B1 | 1/2001 | Hung et al. |
| 6,278,236 B1 | 8/2001 | Madathil et al. |
| 6,284,393 B1 | 9/2001 | Hosokawa et al. |
| 6,509,110 B1 | 1/2003 | Salbeck et al. |
| 9,595,682 B2 | 3/2017 | Buchwald |
| 2009/0105488 A1 | 4/2009 | Cheng et al. |
| 2014/0124762 A1 | 5/2014 | Buchwald et al. |

FOREIGN PATENT DOCUMENTS

| | | |
|---|---|---|
| WO | WO 00/70655 A2 | 11/2000 |
| WO | WO 01/41512 A1 | 6/2001 |
| WO | WO 01/93642 A1 | 12/2001 |

OTHER PUBLICATIONS

Hart, Iptycenes, cuppendophanes and cappedophanes. Pure and Applied Chemistry. 1993; 65(1):27-34.

Lee et al., Luminous butterflies: efficient exciton harvesting by benzophenone derivatives for full-color delayed fluorescence OLEDs. Angew Chem Int Ed. Jun. 2014;126:6520-4. Epub May 18, 2014.

Schmidt et al., Occurrence, biogenesis, and synthesis of biologically active carbazole alkaloids. Chem. Rev. 2012;112(6):3193-3328.

Shahlai et al., Synthesis of supertriptycene and two related iptycenes. Journal of Organic Chemistry. 1991;56:6905-12.

Yamada et al., Solution-processed anthradithiophene—PCBM p—n junction photovoltaic cells fabricated by using the photoprecursor method. Chem Commun. 2013;49:11638-40.

International Search Report and Written Opinion for PCT/US2016/023709 dated Jun. 20, 2016.

Bouffard et al., Iptycene-derived pyridazines and phthalazines. J Org Chem. Dec. 21, 2007;72(26):10166-80. Epub Nov. 15, 2007.

Duvanel et al., Excited-state dynamics of donor-acceptor bridged systems containing a boron-dipyrromethene chromophore: interplay between charge separation and reorientational motion. J Phys Chem A. Jun. 28, 2007;111(25):5361-9. Epub Jun. 5, 2007.

Tan et al., Effects of iptycene scaffolds on the photoluminescence of N,N dimethylaminobenzonitrile and its analogues. Photochem Photobiol Sci. Feb. 2014;13(2):211-23. doi: 10.1039/c3pp50196e.

* cited by examiner

2BT-QNX(CN)2

2BT-QNX(CF3)2

2DBT-QNX(CN)2

2DBT-QNX(CF3)2

| Al (100nm) |
|---|
| LiF (0.8nm) |
| TmPyPb (40nm) |
| Emission layer (30nm) |
| TcTa (30nm) |
| $MoO_3$ (5nm) |
| ITO |

FIG. 8

ORGANIC CONDUCTIVE MATERIALS AND DEVICES

RELATED APPLICATIONS

This application claims priority under 35 U.S.C. § 119(e) to U.S. Provisional Application Ser. No. 62/137,714, entitled "Organic Conductive Materials And Devices" filed on Mar. 24, 2015, which is incorporated herein by reference in its entirety for all purposes.

FIELD OF THE INVENTION

Embodiments described herein relate to compositions and devices including bridged bicyclic compounds such as iptycene-based compounds.

BACKGROUND OF THE INVENTION

For organic light-emitting diodes, efficient conversion of electrical charges to light is a critical process. When two changes or opposite sign (cations and anions) combine on a emitter molecule they can give excited states with different electron spin configurations. Most often the electron spins are aligned represents a triplet state and for purely organic materials these materials generally are only weakly emissive because the radiative transition to the ground state requires a forbidden spin transition. Singlet states can also be produced and are more strongly emissive with allowed radiative transitions to the ground state. To fully transform all of the excited states into luminance from a device, materials which facilitate interconversion of triplet states into singlet states are desired.

SUMMARY OF THE INVENTION

Compositions, devices and methods are provided comprising bridged bicyclic compounds are provided.

In one aspect, compositions are provided. In some embodiments, the composition comprises a [2.2.Z] bridged bicyclic compound comprising a structure as in Formula (I)

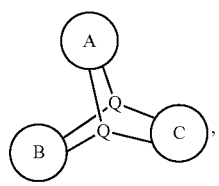

(I)

Wherein each Q is the same or different and a tetrahedral bridgehead group, at least two of A, B, and C are the same or different and include a pi-electron group, Z is 1 or 2, at least one of the pi-electron groups is an electron donating group comprising an optionally substituted carbocyclyl or optionally substituted heteroaryl moiety rigidly bonded to the tetrahedral bridgehead group, at least one of the pi-electron groups is an electron accepting group comprising an optionally substituted heterocyclyl or optionally substituted heteroaryl moiety rigidly bonded to the tetrahedral bridgehead group, and the [2.2.Z] bridged bicyclic compound has a singlet emission lifetime that is at least about 10 times greater than a singlet emission lifetime of at least one of an isolated A, B, and C group.

In some embodiments, the composition comprises a [2.2.Z] bridged bicyclic compound comprising a structure as in Formula (I) wherein each Q is the same or different and a tetrahedral bridgehead group, at least two of A, B, and C are the same or different and include a pi-electron group, Z is 1 or 2, at least one of the pi-electron groups is an electron donating group comprising an optionally substituted carbocyclyl or optionally substituted heteroaryl moiety rigidly bonded to the tetrahedral bridgehead group, at least one of the pi-electron systems is an electron accepting group comprising an optionally substituted heterocyclyl or optionally substituted heteroaryl moiety rigidly bonded to the tetrahedral bridgehead group, and the [2.2.Z] bridged bicyclic compound exhibits an energy gap between a singlet excited state and a triplet excited state in solution or in host matrix of less than about 0.2 eV.

In some embodiments, the composition comprises a [2.2.Z] bridged bicyclic compound comprising a structure as in Formula (I) wherein each Q is the same or different and a tetrahedral bridgehead group, at least two of A, B, and C are the same or different and include a pi-electron group, Z is 1 or 2, at least one of the pi-electron groups is an electron donating group comprising an optionally substituted carbocyclyl or optionally substituted heteroaryl moiety rigidly bonded to the tetrahedral bridgehead group, at least one of the pi-electron systems is an electron accepting group comprising an optionally substituted heterocyclyl or optionally substituted heteroaryl moiety rigidly bonded to the tetrahedral bridgehead group, the [2.2.Z] bridged bicyclic compound is in the solid state, and the [2.2.Z] bridged bicyclic compound has in solution or in host matrix a peak emission wavelength between 400 and 480 nm.

In another aspect, devices are provided. In some embodiments, the device comprises an emissive layer and the [2.2.Z] bridged bicyclic compound comprising a structure as in Formula (I), and an electrode layer.

In yet another aspect, methods for generating light are provided. In some embodiments, the method for generating light comprises applying an electric potential to an emissive layer, the emissive layer comprising the compound comprising a structure as in Formula (I), wherein the wavelength of the generated light is between about 400 nm and about 480 nm.

Other aspects, embodiments and features of the invention will become apparent from the following detailed description when considered in conjunction with the accompanying drawings. The accompanying figures are schematic and are not intended to be drawn to scale. For purposes of clarity, not every component is labeled in every figure, nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

BRIEF DESCRIPTION OF THE DRAWINGS

FIG. 8 shows a schematic of a device comprising bridged bicyclic compounds, according to some embodiments;

DETAILED DESCRIPTION

Figures 1A, 1B:
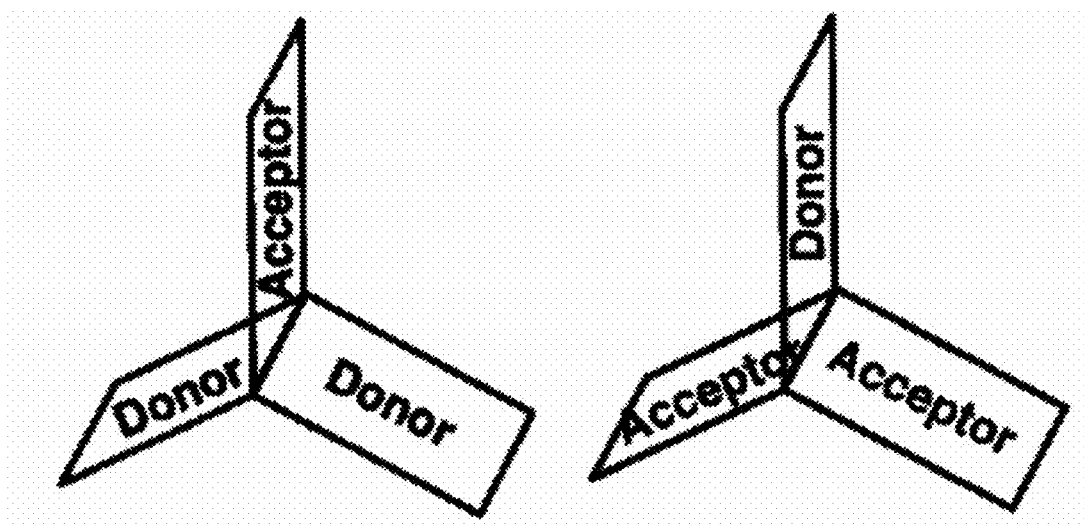
FIGS. 1A-1B shows a schematic of bridged bicyclic compounds having donor and acceptor regions, according to one set of embodiments.

Embodiments described herein relate to compositions including bridged bicyclic compounds such as iptycene-based structures and extended iptycene structures. In some cases, the bridged bicyclic compound includes various moieties having desirable physical and electronic properties. In some embodiments, the compositions may be useful in organic light-emitting diodes (OLEDs), chemical sensors, organic photovoltaics, and other devices. An advantageous feature of embodiments described herein is the ability to tune the electronic properties of the compositions in order to suit a particular application. For example, compositions described herein may exhibit thermally activated delayed fluorescence (TADF) and may be useful as emissive chromophores in OLED devices. In other cases, the compositions may exhibit high-lying triplet states and may be able to trap various triplet emitters, making them attractive host materials for OLED devices. In some cases, the emitters and the host can combine to create a more effective TDAF material than would exist than if the two components were separate. In some cases, the composition may also be readily soluble and processable, and exhibit excellent thermal stability.

In some cases, the composition may include a bridged bicycle compound (e.g., a iptycene-based structure) having various functional groups arranged at specific locations within the bridged bicyclic compound to generate a desired electronic structure or to produce desired electronic properties. For example, arrangement of various electron-withdrawing or electron-deficient groups and/or electron-donating or electron-rich groups within the bridged bicyclic compound may advantageously create low overlap between the highest occupied molecular orbital (HOMO) and the lowest unoccupied molecular orbital (LUMO), relative to previous compositions. This may result in bridged bicyclic compounds having a relatively small energy gap ($\Delta E_{ST}$) between the lowest singlet and triplet excited states, allowing for TADF with high photoluminescence efficiency (e.g., high quantum yield) and extended lifetimes.

In some cases, the bridged bicyclic compound may include one or more pi-electron groups. In some embodiments, at least one of the pi-electron groups contain an electron-withdrawing group and at least one of the pi-electron groups is an electron-accepting group. The effect of these groups is generally to lower the lowest unoccupied molecular orbital and localize it on the pi-electron group. In certain embodiments, the bridged bicyclic compound includes a first portion containing electron-withdrawing groups and a second portion lacking such electron-withdrawing groups. In some cases, the second portion may include electron-donating or electron-rich groups. In some cases, the highest occupied molecular orbital is raised by the lack of electron-withdrawing groups or the addition of the electron-donating groups such that it is localized on the second pi-electron group. In some embodiments, the bridged-bicyclic compound is an iptycene-based structure. In other embodiments the bridged-bicyclic compound is a not an iptycene. Some embodiments may involve an iptycene-based structure having an electron donor portion optionally containing one or more electron-donating groups, and an electron acceptor portion covalently bonded to the electron donor portion and containing one or more electron-withdrawing groups.

FIG. 1A illustrates a bridged bicyclic compound having an electron-withdrawing group (i.e. acceptor) and two electron-donating groups (i.e. donor). FIG. 1B illustrates a bridged bicyclic compound have two electron-withdrawing groups (i.e. acceptor) and an electron-donating group (i.e. donor). Electron-withdrawing groups and electron-accepting groups are described in more detail, below.

The bridged bicyclic compounds described herein generally have the structure as in Formula (I):

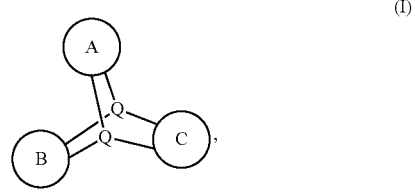

wherein A, B, and C are the same or different and at least two of A, B, and C include pi-electron groups (e.g., an electron donating group, an electron accepting group) and Q is a tetrahedral bridgehead group. For example, in some embodiments, the bridged bicyclic compound is a [2.2.1] bridged bicyclic compound having a structure as in Formula (I) wherein A and B are different and include pi-electron groups (e.g., A comprises an electron donating group, B comprises an electron accepting group), and C is oxygen, NR, or $CR_2$, where R is H or phenyl. In certain embodiments, the bridged bicyclic compounds is a [2.2.2] bridged bicyclic compound having a structure as in Formula (I) wherein A, B, and C are the same or different and include pi-electron groups (e.g., A and B comprise electron donating groups and C comprises an electron accepting group, A and B comprise electron accepting groups and C comprises an electron donating group). In some embodiments, Q is CH. In other embodiments, the bridged bicyclic compounds is a [2.2.1] bridged bicyclic compound having a structure as in Formula (I) wherein A, B, and C are the same or different and include pi-electron groups (e.g., A and B comprise electron donating groups and C comprises an electron accepting group, A and B comprise electron accepting groups and C comprises an electron donating group).

Generally, the constituent groups A, B, and/or C alone (e.g., isolated as a macromolecule in contrast to being bound to Q in the structure of Formula (I) and/or bound to another molecule such as a methyl group), have relatively short singlet emission lifetimes (e.g., on the order of approximately 10 ns or less). The bridged bicyclic compounds described herein generally have a different excited state electronic structure and generally have more complex lifetimes with a delayed singlet emission lifetime that is at least about 10, at least about 12, at least about 15, or at least about 20 times greater than a singlet emission lifetime from one of the isolated constituents A, B, and/or C. For example, in some embodiments, the bridged bicyclic compound has a singlet emission lifetime or greater than or equal to about 0.1 microsecond, greater than or equal to about 0.5 microseconds, greater than or equal to about 1 microseconds, or greater than or equal to about 10 microseconds. In certain embodiments, the bridged bicyclic compound has a singlet emission lifetime of less than or equal to about 50 microseconds, less than or equal to about 20 microseconds, less than or equal to about 10 microseconds, less than or equal to about 5 microseconds, or less than or equal to about 2 microseconds. Combinations of the above-referenced ranges are also possible (e.g., between about 1 microsecond and about 50 microseconds, between about 1 microsecond and about 5 microseconds Those skilled in the art would be capable of selecting methods for determining singlet emission lifetimes including by time resolved detection of the emission.

Bridged bicyclic compounds described herein may be configured such that they emit a particular wavelength of electromagnetic radiation (i.e. light). The wavelength of an emission refers to the wavelength at which the peak maximum of the emission occurs in an emission spectrum. The emission may be a particular peak having the largest intensity in an emission spectrum (e.g. a fluorescence spectrum), or, alternatively, the emission may be a peak in an emission spectrum that has at least a defined maximum, but has a smaller intensity relative to other peaks in the emission spectrum.

As used herein, "emission" may be luminescence emission, in which "luminescence" is defined as an emission of ultraviolet or visible radiation. Specific types of luminescence include fluorescence, in which a time interval between absorption and emission of visible radiation ranges from $10^{-12}$ to $10^{-7}$ s, phosphorescence, other types of luminescence such as electroluminescence, and the like. For example, the emission may be "chemiluminescence," which refers to the emission of radiation due to a chemical reaction, or "electrochemiluminescence," which refers to emission of radiation due to electrochemical reactions. In some cases, the emission may be fluorescence emission.

In some embodiments, the bridged bicyclic compound described herein has particular peak emission wavelength (e.g., a peak emission wavelength in solution or in a host matrix). In some embodiments, the peak emission wavelength of light emitted by the bridged bicyclic compound (or a device including the bridged bicyclic compound) is between about 300 nm and about 700 nm. For example, in some embodiments, the peak emission wavelength of light emitted by the bridged bicyclic compound may be greater than or equal to about 370 nm, greater than or equal to about 400 nm, greater than or equal to about 500 nm, or greater than or equal to about 600 nm. In certain embodiments, the peak emission wavelength of light emitted by the bridged bicyclic compound may be less than about 700 nm, less than about 600 nm, less than about 500 nm, or less than about 400 nm. Combinations of the above-referenced ranges are also possible (e.g., an average wavelength between about 370 nm and about 700 nm, between about 400 nm and about 600 nm, between about 400 nm and about 500 nm).

In a particular set of embodiments, the bridged bicyclic compound may have a peak emission wavelength of at least about 400 nm, at least about 420 nm, at least about 440 nm, at least about 460 nm, or at least about 480 nm. In certain embodiments, the bridged bicyclic compound may have a peak emission wavelength of less than or equal to about 500 nm, less than or equal to about 480 nm, less than or equal to about 460 nm, less than or equal to about 440 nm, or less than or equal to about 420 nm. Combinations of the above-referenced ranges are also possible (e.g., between about 400 nm and about 500 nm, between about 400 nm and about 480 nm). Devices comprising the bridged bicyclic compounds described herein may have an average electroluminescence wavelength in the same range as the peak emission wavelength of the bridged bicyclic compound (e.g., between about 400 nm and about 480 nm). For example, in some embodiments, applying an electric potential to a device comprising a layer comprising the bridged bicyclic compound may generate light having average wavelength ranging between about 400 nm and about 480 nm. Devices and methods for generating light are described in more detail, below.

Some embodiments provide bridged bicyclic compounds such as an iptycene-based compound comprising an iptycene core and one or more optionally substituted heterocyclyl or optionally substituted heteroaryl moieties rigidly bonded to the iptycene-based core. In some cases, a group may be rigidly bonded to a core such that the group does not easily rotate about a bond axis, e.g., a bond that binds the group to the core. In one embodiment, the group rotates no more than about 180°, no more than about 120°, no more than about 60°, no more than about 30°, or less, about a bond that binds the group to the core. In some cases, a group may be rigidly bound to the core via two covalent bonds. For example, a group may be fused to the core via covalent bonds to two adjacent atoms of the core. In some embodiments, the heterocyclyl or heteroaryl groups may be substituted with one or more electron-withdrawing groups.

In some cases, the heterocyclyl or heteroaryl moiety may be rigidly bonded to the iptycene core and/or may define at least a portion of the iptycene core. For example, the iptycene core may include one or more phenyl rings that may be extended or functionalized so as to form a heterocyclyl or heteroaryl moiety (e.g., a pyridine, a parazine, an indazole group, a carbazole group, a benzothiphene group, a dibenzothiophene group) which includes one or more phenyl rings of the iptycene core.

Figure 2A:
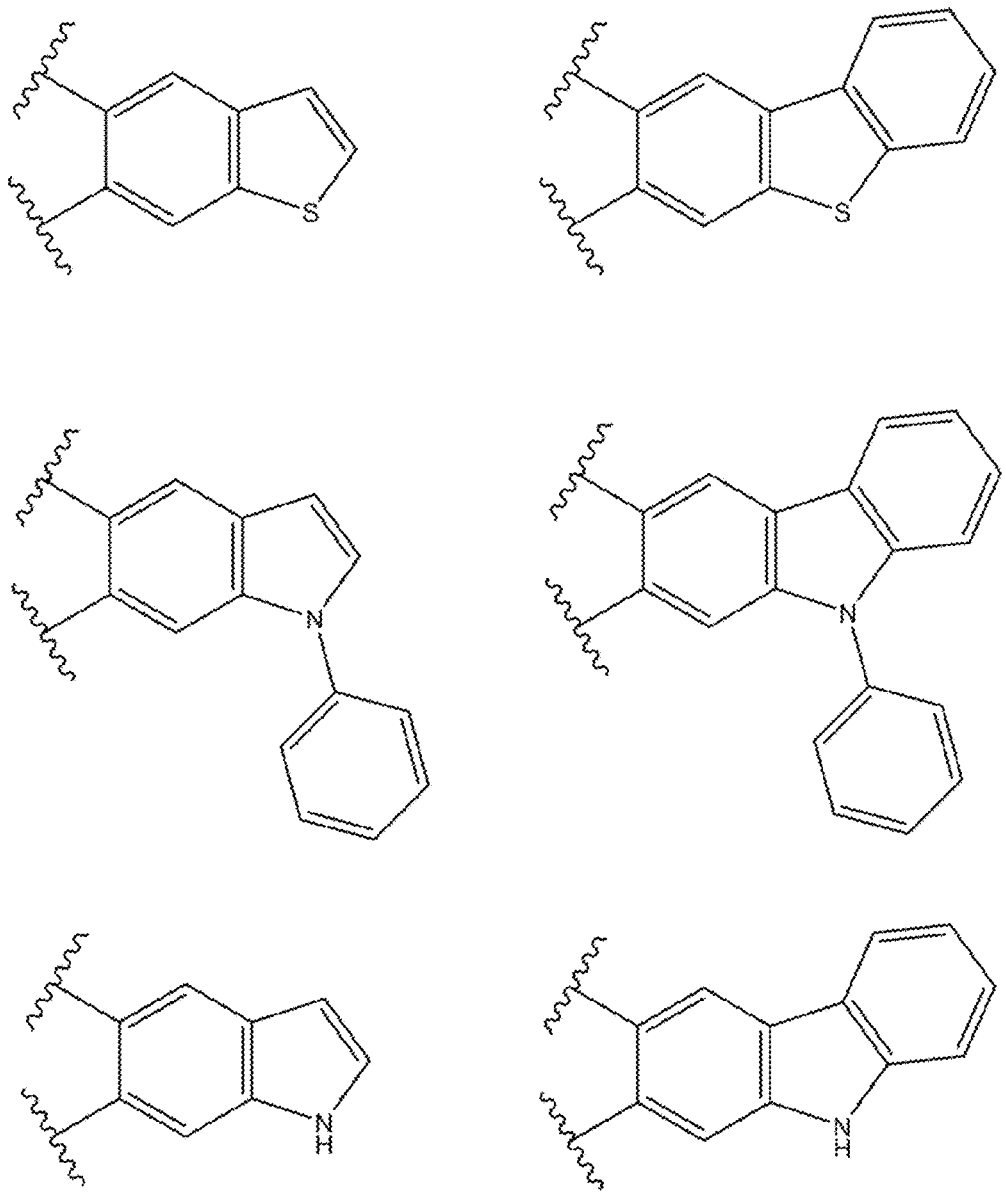
FIGS. 2A-2B shows examples of (A) electron donating groups and (B) electron accepting groups, according to some embodiments.

Some embodiments may involve an iptycene-based structure containing one or more indole moieties, carbazole moieties, benzothiphene moieties, or dibenzothiophene moieties, optionally substituted, as electron donor groups. In some embodiments, the iptycene-based structure includes an indole and/or carbazole moiety substituted with an N-aryl group (e.g., a phenyl group) at the nitrogen atom (e.g., and may be used to tune electronic properties of the bridged bicyclic compound). In some embodiments, the indole, carbazole, benzothiophene, or dibenzothiophene moiety may be attached to the iptycene-based structure. In some embodiments, the indole, carbazole, benzothiophene, or dibenzothiophene moiety may rigidly bonded to an iptycene core and may define at least a portion of the iptycene core. FIG. 2A includes non-limiting examples of electron donating groups, optionally substituted, which may be rigidly bonded to the bridged bicyclic (e.g., iptycene) core.

Figure 2B:
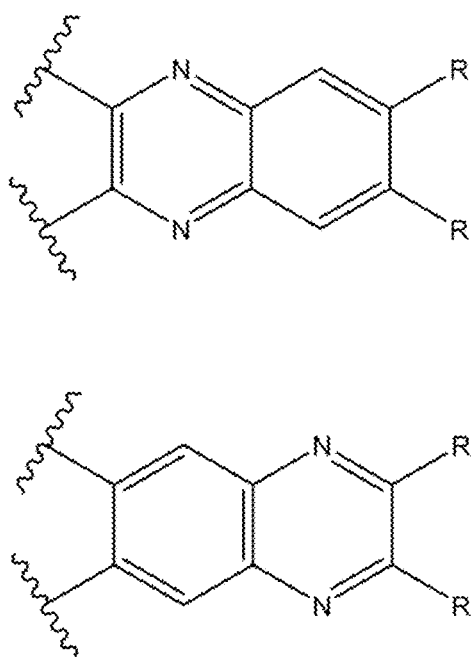

Some embodiments may involve an iptycene-based structure containing one or more N-containing heteroaromatics (e.g., such as quinoxaline), optionally substituted, as electron accepting groups. In some embodiments, the N-containing heteroaromatic is substituted with an electron withdrawing group such as a cyano group, trifluoromethyl, an ester group (e.g., $CO_2Me$), or the like (e.g., and may be used to tune electronic properties of the bridged bicyclic compound). FIG. 2B includes non-limiting examples of electron accepting groups, optionally substituted, which may be rigidly bonded to the bridged bicyclic (e.g., iptycene) core.

In some embodiments, the bridged bicyclic compound includes a triptycene core. In some embodiments, the bridged bicyclic compound includes a pentiptycene core. It should be understood that the compound may include other, extended iptycene cores which have, for example, additional numbers of branches, arene planes, and/or extended bridgehead structures. For example, the central phenyl ring of a pentiptycene core may have an extended structure such as a central anthracene ring system. The synthesis of iptycenes and like molecules is described in, for example, Hart, "Iptycenes, Cuppendophanes and Cappedophanes," Pure and Applied Chemistry, 65(1):27-34 (1993); and Shahlia et al., "Synthesis of Supertriptycene and Two Related Iptycenes," Journal of Organic Chemistry, 56:6905-6912 (1991), the contents of which are incorporated herein by reference. In some embodiments, the iptycene core may be synthesized via a Diels-Alder reaction between an anthracene species and a benzyne species.

In some cases, bridged bicyclic compounds and structures disclosed herein may exhibit a solid state singlet-triplet energy gap (e.g., a solid state singlet-triplet energy gap as determined in solution or in a host matrix) of less than or equal to about 0.2 eV less than or equal to about 0.15 eV, less than or equal to about 0.1 eV, less than or equal to about 0.05 eV, less than or equal to about 0.02 eV, less than or equal to about 0.01 eV, or less than or equal to about 0.005 eV. For example, the bridged bicyclic compound may exhibit a singlet-triplet energy gap in the range of about 0.005 to about 0.05 eV, about 0.005 to about 0.02 eV, or about 0.01 to about 0.2 eV, in solid state. In some cases, the bridged bicyclic compound may exhibit a solid state singlet-triplet energy gap of about 0.005 eV. In some cases, the bridged bicyclic compound may exhibit a solid-state singlet-triplet energy gap of about 0.01 eV. In some cases, the bridged bicyclic compound may exhibit a solid state singlet-triplet energy gap of about 0.05 eV. In some cases, the iptycene-based compound may exhibit a solid state singlet-triplet energy gap of about 0.1 eV. In some cases, the bridged bicyclic compound may exhibit a solid state singlet-triplet energy gap of about 0.2 eV. In some cases the singlet-triplet energy gap of the bridged bicyclic compound will vary with the host matrix. For example, this change may be the result of direct interactions of one or more of the pi-electron systems with the host matrix or the result of the local dielectric environment provided by the host matrix. The solid state singlet-triplet energy gap of a material may be determine by calculating the energy difference between singlet ($S_1$) and triplet ($T_1$) energy levels ($\Delta E_{ST}$) of the material in solid state, as calculated from the onsets of the fluorescence and phosphorescence spectra of the material or as modeled by analyzing the delayed emission rates as a function of temperature.

In some cases, the bridged bicyclic compounds and structures disclosed herein can be used to create OLED devices that exhibit quantum yield of greater than 25%, such as about 30%, about 35%, about 40%, about 45%, about 50%, about 55%, about 60%, or greater. In some cases, devices incorporating the iptycene-based compounds and structures disclosed herein may exhibit an internal quantum yields in solution and/or the solid state of about 70%, about 75%, about 80%, about 85%, about 90%, or greater.

Devices incorporating the bridged bicyclic compounds disclosed herein are also provided. For example, the bridged bicyclic compound may be useful as a chromophore in a luminescence-based device such as an OLED. In some cases, the bridged bicyclic compound may include an iptycene core and at least one heterocyclyl or heteroaryl moiety bonded to the iptycene core. The heterocyclyl or heteroaryl moiety may be substituted with at least one electron-withdrawing group such that the iptycene-based compound exhibits a singlet-triplet energy gap of 0.2 eV or less (e.g., 0.1 eV or less) when the iptycene-based compound in solid state. Such devices may advantageously exhibit TADF with increased quantum yields.

In some embodiments, the bridged bicyclic (e.g., iptycene-based) compound has a structure as in Formula (II) or Formula (III),

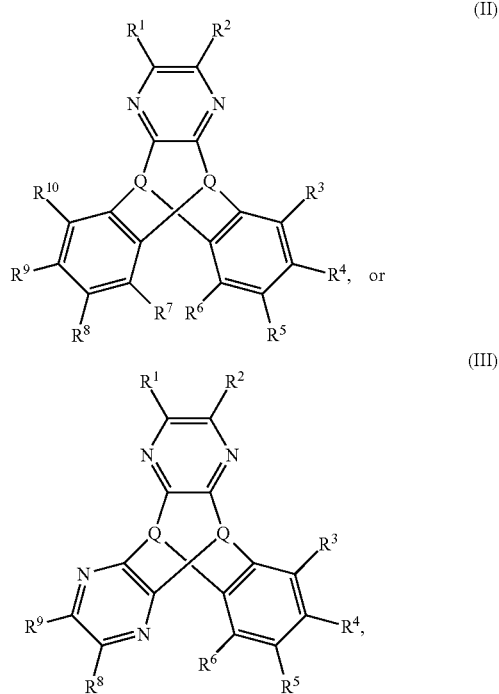

wherein:
Q is a tetrahedral bridgehead group, such as CH;
$R^1$-$R^{10}$ can be the same or different and are hydrogen, halo, hydroxyl, amino, alkyl, heteroalkyl, alkenyl, alkynyl, aryl, heteroaryl, heterocyclyl, or a carbonyl group, any of which is optionally substituted, or, any two adjacent groups of $R^1$-$R^{10}$ can be joined together to form an optionally substituted ring, provided that two adjacent groups of $R^1$-$R^{10}$ are joined together to form at least one optionally substituted heterocyclic group or at least one optionally substituted heteroaryl group. In some cases, $R^1$ and $R^2$, $R^4$ and $R^5$, and/or $R^8$ and $R^9$ are joined together to form an optionally substituted heterocyclic group or an optionally substituted heteroaryl group. For example, two adjacent groups of $R^1$-$R^{10}$ may be joined together to form a ring, such that a carbazole, indole, benzothiophene, or dibenzothiphene moiety is formed including the phenyl ring of the core iptycene structure.

The term "bridgehead group" is given its typically meaning in the art and generally refers to an unbranched atom or chain of atoms common to two or more rings in a polycyclic compound. Non-limiting examples of suitable bridgehead groups include C—H, C-aryl, C-alkyl, N, P, Si-aryl, Si-alkyl, or P=O. In some embodiments, Q is C—H, C-aryl, C-alkyl, N, P, Si-aryl, Si-alkyl, or P=O.

In some cases, one or more of $R^1$-$R^{10}$ may be bound to a polymer, as described in more detail below.

In some cases, the compound is a [2.2.2] bridged bicyclic compound having a structure as in Formula (IV) or Formula (V):

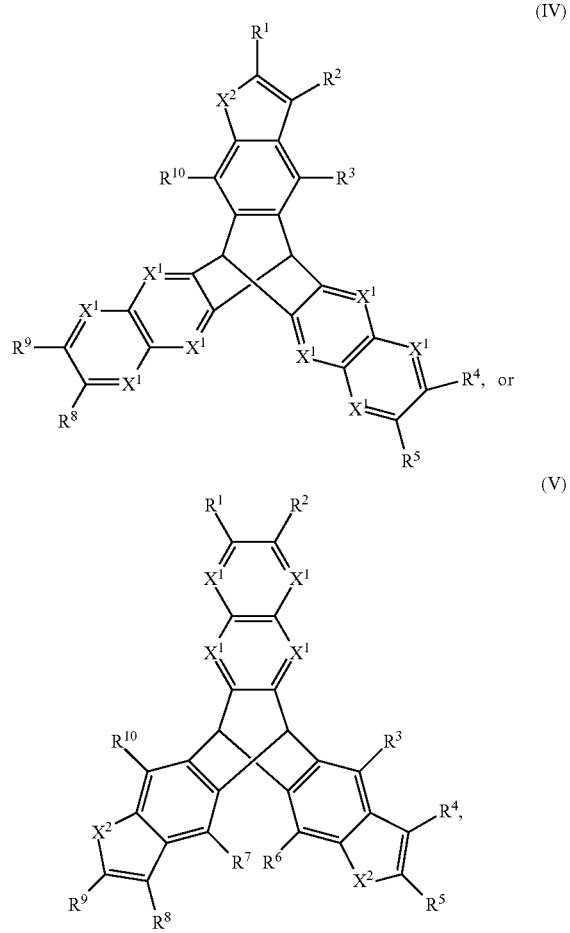

wherein:

each $X^1$ can be the same or different and are N or CH, provided at least 2 of $X^1$ is N;

each $X^2$ can be the same or different and are NR', CR'$_2$, O, or S, wherein R' is H, or phenyl, optionally substituted; and $R^1$-$R^{10}$ can be the same or different and are hydrogen, halo, hydroxyl, amino, alkyl, heteroalkyl, alkenyl, alkynyl, aryl, heteroaryl, heterocyclyl, or a carbonyl group, any of which is optionally substituted, or, any two adjacent groups of $R^1$-$R^{10}$ can be joined together to form an optionally substituted ring, provided that two adjacent groups of $R^1$-$R^{10}$ are joined together to form at least one optionally substituted heterocyclic group or at least one optionally substituted heteroaryl group. In some cases, $R^1$ and $R^2$, $R^4$ and $R^5$, and/or $R^8$ and $R^9$ are joined together to form an optionally substituted heterocyclic group or an optionally substituted heteroaryl group. For example, two adjacent groups of $R^1$-$R^{10}$ may be joined together to form a ring, such that a carbazole, indole, benzothiophene, or dibenzothiphene moiety is formed including the phenyl ring of the core iptycene structure.

In some embodiments, each $X^2$ can be the same or different and are O, S, or NR', wherein R' is H, alkyl, heteroalkyl, alkenyl, heteroalkenyl, alkynyl, aryl, heteroaryl, heterocyclyl, or a carbonyl group, any of which is optionally substituted. In some embodiments, each $X^2$ is NH. In some embodiments, each $X^2$ is N(R'), wherein R' is an optionally substituted aryl or an optionally substituted heteroaryl.

In the embodiments described herein, $R^1$-$R^{10}$ can be the same or different and can be alkyl, alkoxy, alkyl sulfanyl, alkylamino, dialkylamino, alkenyl, alkynyl, cycloalkyl, an cycloalkenyl, an heterocyclyl, an aryl, an heteroaryl, an aralkyl, an heteroaralkyl, a haloalkyl, —C(O)NR$^a$R$^b$, —NR$^c$C(O)R$^d$, halo, —OR$^c$, cyano, nitro, haloalkoxy, —C(O)R$^c$, —NR$^a$R$^b$, —SR$^c$, —C(O)OR$^c$, —OC(O)R$^c$, —NR$^c$C(O)NR$^a$R$^b$, OC(O)NR$^a$R$^b$, NR$^c$C(O)OR$^d$, S(O)$_p$R$^c$, or —S(O)$_p$NR$^a$R$^b$, wherein R$^a$ and R$^b$, for each occurrence are, independently, H, an optionally substituted alkyl, an optionally substituted alkenyl, an optionally substituted alkynyl, an optionally substituted cycloalkyl, an optionally substituted cycloalkenyl, an optionally substituted heterocyclyl, an optionally substituted aryl, an optionally substituted heteroaryl, an optionally substituted aralkyl, or an optionally substituted heteroaralkyl; or R$^a$ and R$^b$ taken together with the nitrogen to which they are attached form optionally substituted heterocyclyl or optionally substituted heteroaryl; and R$^c$ and R$^d$ for each occurrence are, independently, H, an optionally substituted alkyl, an optionally substituted alkenyl, an optionally substituted alkynyl, an optionally substituted cycloalkyl, an optionally substituted cycloalkenyl, an optionally substituted heterocyclyl, an optionally substituted aryl, an optionally substituted heteroaryl, an optionally substituted aralkyl, or an optionally substituted heteroaralkyl. For example, For example, one or more of $R^1$-$R^{10}$ may be the same or different an electron-withdrawing groups, such as halo (fluoro), cyano, nitro, fluoroalkyl, fluoroalkoxy, fluoroaryl, or a carbonyl group. For example, in some embodiments, one or more of $R^1$-$R^{10}$ is the same or different and cyano, $CF_3$, $OCF_3$, $SCF_3$, $SF_5$, or a carbonyl group.

In some cases, one or more of $X^1$, $X^2$, and/or $R^1$-$R^{10}$ may be bound to a polymer, as described in more detail below.

Non-limiting examples of [2.2.2] bridged bicyclic compounds as described above are shown in FIGS. 2C-2D.

In one set of embodiments, the bridged bicyclic compound is a [2.2.1] bridged bicyclic compound having the structure as in Formula (VI):

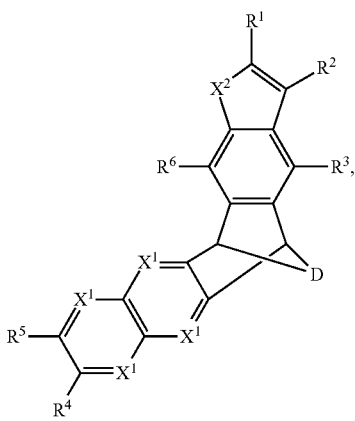

(VI)

wherein:

each $X^1$ can be the same or different and are N or CH, provided at least 2 of $X^1$ is N;

$X^2$ is NR', CR'$_2$, O, or S;

D is O, NR' or CR'$_2$;

each R' is the same or different and H, or phenyl, optionally substituted; and $R^1$-$R^6$ can be the same or different and are hydrogen, halo, hydroxyl, amino, alkyl, heteroalkyl, alkenyl, alkynyl, aryl, heteroaryl, heterocyclyl, or a carbonyl group, any of which is optionally substituted, or, any two adjacent groups of $R^1$-$R^6$ can be joined together to form an optionally substituted ring, provided that two adjacent groups of $R^1$-$R^6$ are joined together to form at least one optionally substituted heterocyclic group or at least one optionally substituted heteroaryl group. In some cases, $R^1$ and $R^2$ and/or $R^4$ and $R^5$ are joined together to form an optionally substituted heterocyclic group or an optionally substituted heteroaryl group. For example, two adjacent groups of $R^1$-$R^6$ may be joined together to form a ring, such that a carbazole, indole, benzothiophene, or dibenzothiphene moiety is formed including the phenyl ring of the core iptycene structure.

In some embodiments, $X^2$ is O, S, or NR', wherein R' is H, alkyl, heteroalkyl, alkenyl, heteroalkenyl, alkynyl, aryl, heteroaryl, heterocyclyl, or a carbonyl group, any of which is optionally substituted. In some embodiments, $X^2$ is NH.

In the embodiments described herein, $R^1$-$R^6$ can be the same or different and can be alkyl, alkoxy, alkyl sulfanyl, alkylamino, dialkylamino, alkenyl, alkynyl, cycloalkyl, an cycloalkenyl, an heterocyclyl, an aryl, an heteroaryl, an aralkyl, an heteroaralkyl, a haloalkyl, —C(O)NR$^a$R$^b$, —NR$^c$C(O)R$^d$, halo, —OR$^c$, cyano, nitro, haloalkoxy, —C(O)R$^c$, —NR$^a$R$^b$, —SR$^c$, —C(O)OR$^c$, —OC(O)R$^c$, —NR$^c$C(O)NR$^a$R$^b$, OC(O)NR$^a$R$^b$, NR$^c$C(O)OR$^d$, S(O)$_p$R$^c$, or —S(O)$_p$NR$^a$R$^b$, wherein R$^a$ and R$^b$, for each occurrence are, independently, H, an optionally substituted alkyl, an optionally substituted alkenyl, an optionally substituted alkynyl, an optionally substituted cycloalkyl, an optionally substituted cycloalkenyl, an optionally substituted heterocyclyl, an optionally substituted aryl, an optionally substituted heteroaryl, an optionally substituted aralkyl, or an optionally substituted heteroaralkyl; or R$^a$ and R$^b$ taken together with the nitrogen to which they are attached form optionally substituted heterocyclyl or optionally substituted heteroaryl; and R$^c$ and R$^d$ for each occurrence are, independently, H, an optionally substituted alkyl, an optionally substituted alkenyl, an optionally substituted alkynyl, an optionally substituted cycloalkyl, an optionally substituted cycloalkenyl, an optionally substituted heterocyclyl, an optionally substituted aryl, an optionally substituted heteroaryl, an optionally substituted aralkyl, or an optionally substituted heteroaralkyl. For example, For example, one or more of $R^1$-$R^6$ may be the same or different an electron-withdrawing groups, such as halo (fluoro), cyano, nitro, fluoroalkyl, fluoroalkoxy, fluoroaryl, or a carbonyl group. For example, in some embodiments, one or more of $R^1$-$R^6$ is the same or different and cyano, $CF_3$, $OCF_3$, $SCF_3$, $SF_5$, or a carbonyl group.

In some cases, one or more of $X^1$, $X^2$, D, and/or $R^1$-$R^{10}$ may be bound to a polymer, as described in more detail below.

In one set of embodiments, the bridged bicyclic compound has the structure as in Formula (VII) or Formula (VIII):

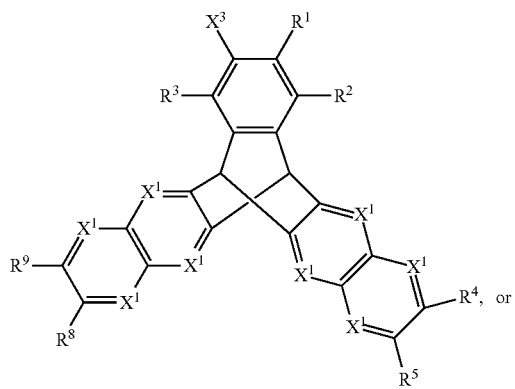

(VII)

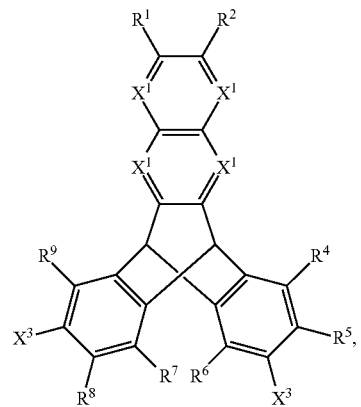

(VIII)

wherein:

each $X^1$ can be the same or different and are N or CH, provided at least 2 of $X^1$ is N;

$X^3$ can be the same or different and are NR'$_2$, SR', wherein each R' is the same or different and H, or phenyl, optionally substituted; and $R^1$-$R^9$ can be the same or different and are hydrogen, halo, hydroxyl, amino, alkyl, heteroalkyl, alkenyl, alkynyl, aryl, heteroaryl, heterocyclyl, or a carbonyl group, any of which is optionally substituted, or, any two adjacent groups of $R^1$-$R^9$ can be joined together to form an optionally substituted ring, provided that two adjacent groups of $R^1$-$R^9$ are joined together to form at least one optionally substituted heterocyclic group or at least one optionally substituted heteroaryl group. In some cases, $R^1$ and $R^2$, $R^4$ and $R^5$, and/or $R^7$ and $R^8$ are joined together to form an optionally substituted heterocyclic group or an optionally substituted heteroaryl group. For example, two adjacent groups of $R^1$-$R^9$ may be joined together to form a ring, such that a carbazole, indole, benzothiophene, or dibenzothiphene moiety is formed including the phenyl ring of the core iptycene structure.

In some embodiments, $X^3$ can be SR', or NR'$_2$, wherein each R' is the same or different and H, alkyl, heteroalkyl, alkenyl, heteroalkenyl, alkynyl, aryl, heteroaryl, heterocyclyl, or a carbonyl group, any of which is optionally substituted. In some embodiments, $X^3$ is N(R')$_2$ or S(R'), wherein each R' is an optionally substituted aryl or an optionally substituted heteroaryl. For example, R' may be phenyl substituted with one or more electron-withdrawing groups, such as halo (fluoro), cyano, nitro, fluoroalkyl, fluoroalkoxy, fluoroaryl, or a carbonyl group. In some embodiments, R' is phenyl substituted with fluoro, cyano, $CF_3$, $OCF_3$, $SCF_3$, $SF_5$, or a carbonyl group.

In the embodiments described herein, $R^1$-$R^9$ can be the same or different and can be alkyl, alkoxy, alkyl sulfanyl, alkylamino, dialkylamino, alkenyl, alkynyl, cycloalkyl, an cycloalkenyl, an heterocyclyl, an aryl, an heteroaryl, an aralkyl, an heteroaralkyl, a haloalkyl, —C(O)NR$^a$R$^b$, —NR$^c$C(O)R$^d$, halo, —OR$^c$, cyano, nitro, haloalkoxy, —C(O)R$^c$, —NR$^a$R$^b$, —SR$^c$, —C(O)OR$^c$, —OC(O)R$^c$, —NR$^c$C(O)NR$^a$R$^b$, OC(O)NR$^a$R$^b$, NR$^c$C(O)OR$^d$, S(O)$_p$R$^c$, or —S(O)$_p$NR$^a$R$^b$, wherein R$^a$ and R$^b$, for each occurrence are, independently, H, an optionally substituted alkyl, an optionally substituted alkenyl, an optionally substituted alkynyl, an optionally substituted cycloalkyl, an optionally substituted cycloalkenyl, an optionally substituted heterocyclyl, an optionally substituted aryl, an optionally substituted heteroaryl, an optionally substituted aralkyl, or an optionally substituted heteroaralkyl; or R$^a$ and R$^b$ taken together with the nitrogen to which they are attached form optionally substituted heterocyclyl or optionally substituted heteroaryl; and R$^c$ and R$^d$ for each occurrence are, independently, H, an optionally substituted alkyl, an optionally substituted alkenyl, an optionally substituted alkynyl, an optionally substituted cycloalkyl, an optionally substituted cycloalkenyl, an optionally substituted heterocyclyl, an optionally substituted aryl, an optionally substituted heteroaryl, an optionally substituted aralkyl, or an optionally substituted heteroaralkyl. For example, for example, one or more of $R^1$-$R^{10}$ may be the same or different an electron-withdrawing groups, such as halo (fluoro), cyano, nitro, fluoroalkyl, fluoroalkoxy, fluoroaryl, or a carbonyl group. For example, in some embodiments, one or more of $R^1$-$R^9$ is the same or different and cyano, $CF_3$, $OCF_3$, $SCF_3$, $SF_5$, or a carbonyl group.

In some cases, one or more of $X^1$, $X^3$, and/or $R^1$-$R^{10}$ may be bound to a polymer, as described in more detail below.

Non-limiting examples of [2.2.2] bridged bicyclic compounds as described above are shown in FIG. 2E.

Figure 3:
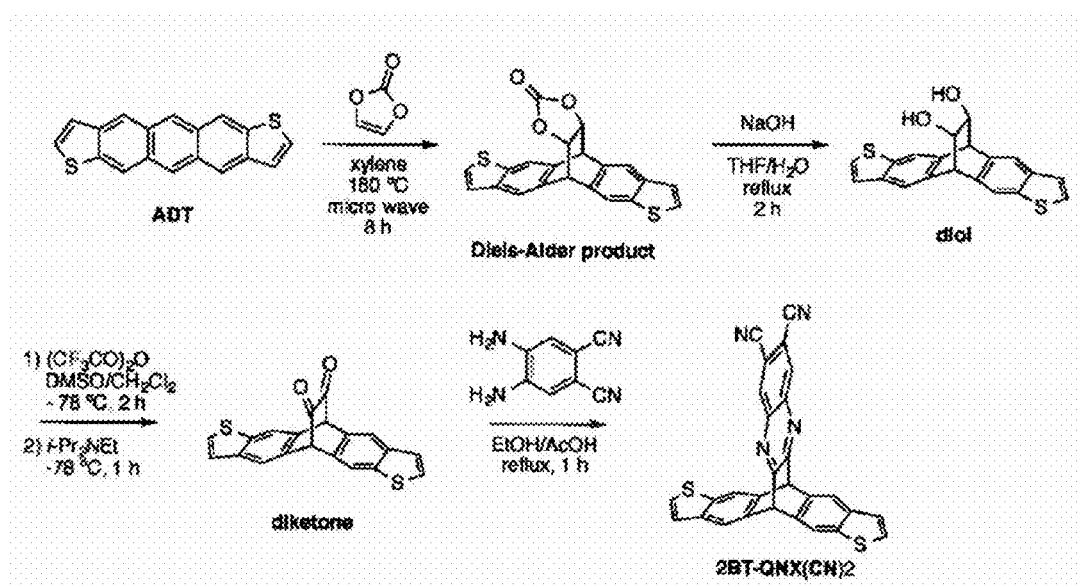
FIG. 3 shows the synthesis of a bridged bicyclic compound, according to one set of embodiments.

Methods for synthesizing such compounds are described herein, as well as in Chou et al., J. Mater. Chem. 2010, 20, 798-805; Schmidt et al., Chem. Rev. 2012, 112(6), 3193-3328; U.S. Publication No. 2009/0105488; and Li et al., *Organic Light-Emitting Materials and Devices*, Boca Raton: Taylor & Francis Group, 2007, the contents of which are incorporated herein by reference. FIG. 3 illustrates the synthesis of an exemplary bridged bicyclic compound including benzothiophene moieties, according to some embodiments.

In some cases, the bridged bicyclic compound may also be incorporated into a polymeric system. In some cases, the bridged bicyclic compound (e.g., the iptycene-based compound) may be covalently bonded to a polymer. For example, bridged bicyclic compound may be covalently bonded to a polymer backbone via a pendant side group. In some cases, the bridged bicyclic compound may be positioned within a polymer backbone. For example, an iptycene-based compound described herein may be bonded to a polymer via atoms of a heterocyclyl or heteroaryl group, and/or via bridgehead atoms of the iptycene core. In some embodiments, the bridged bicyclic compound may be dispersed within a polymer material (e.g., non-covalently dispersed), such as an acrylate or styrene polymer. In some cases, the bridged bicyclic compound may be combined with or dispersed within an electroactive polymer material (e.g., hole-transport polymer, electron-transport polymer).

Some embodiments may provide the bridged bicyclic compound combined with, dispersed within, covalently bonded to, coated with, formed on, or otherwise associated with, one or more materials (e.g., small molecules, polymers, metals, metal complexes, etc.) to form a film or layer in solid state. For example, the bridged bicyclic compound may be combined with an electroactive material to form a film. In some cases, the bridged bicyclic compound may be combined with a hole-transport polymer. In some cases, the bridged bicyclic compound may be combined with an electron-transport polymer. In some cases, the bridged bicyclic compound may be combined with a hole-transport polymer and an electron-transport polymer. In some cases, the bridged bicyclic compound may be combined with a copolymer comprising both hole-transport portions and electron-transport portions. In such embodiments, electrons and/or holes formed within the solid film or layer may interact with the bridged bicyclic compound. In some cases the composite of the combination of the bridged bicyclic compound and the host matrix produces a material with superior TDAF and quantum yields.

Those skilled in the art would be capable of selecting suitable host matrices based upon the teachings of this specification. For example, in some embodiments, the host matrix comprises 1,3-Bis(N-carbazolyl)benzene (mCP). Other host matrices are also possible.

Compositions described herein may be incorporated into various light-sensitive or light-activated devices, such as OLEDs, emissive sensors, or photovoltaic devices. In some embodiments, the composition may be useful in facilitating charge transfer or energy transfer within a device and/or as a hole-transport material. The device may be, for example, an organic light-emitting diode (OLED), an organic integrated circuit (O-IC), an organic field-effect transistor (O-FET), an organic thin-film transistor (O-TFT), an organic light-emitting transistor (O-LET), an organic solar cell (O-SC), an organic optical detector, an organic photoreceptor, an organic field-quench device (O-FQD), a light-emitting electrochemical cell (LEC), an emissive chemosensor, or an organic laser diode (O-laser).

Figure 4:
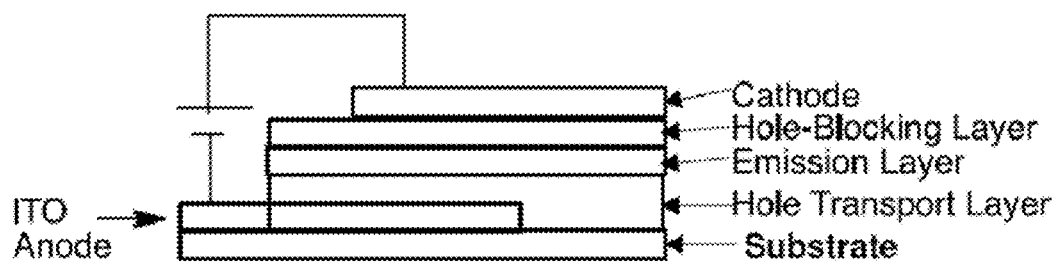
FIG. 4 shows an exemplary OLED device, according to some embodiments.

In some embodiments, the device may be an OLED including a composition as described herein. An OLED device typically includes a multilayer stack including a substrate, one or more electrodes (e.g., a cathode, an anode) and one or more layers including a material capable of emitting light, i.e., an emission layer or light-emitting layer. For example, the OLED device may include an emission layer containing a host material and a guest material, and within which excitons are produced. The layer may be positioned between and in electrical communication with an anode and a cathode. Other additional layers within an OLED may include electron-transporting layers, electroninjecting layer, hole-injecting layers, hole-transporting layers, exciton-blocking layers, spacer layers, connecting layers, hole-blocking layers, and the like. In some cases, the OLED may be a fluorescence-based OLED (e.g., TADF-based OLED). In some cases, the OLED may be a phosphorescence-based OLED. OLED devices, and methods for forming OLEDs, will be known to those of ordinary skill in the art. An illustrative embodiment of an OLED device is shown in FIG. 4.

In a typical OLED, holes and electrons injected into the device can recombine to form excitons, including, in the case of a phosphorescence-based OLED, both singlet and triplet excitons. In some cases, compositions described herein may facilitate the generation and/or retention of, a greater number of triplet excitons relative to singlet excitons. This may be desirable in certain OLEDS, to transform triplet excitons into singlet excitons to create more efficient emission such that a 100% internal quantum efficiency is theoretically possible.

In some cases, compositions described herein may serve as a chromophore within an OLED device.

In some embodiments, it may be desirable to include a hole-blocking layer within the OLED device to help confine the excitons and recombination events to the emission layer. Some examples of hole-blocking materials are described in International Publications WO 00/70655A2, WO 01/41512, and WO 01/93642. Those of ordinary skill in the art would be capable of selecting hole-transport materials, or mixtures thereof, suitable for use in embodiments described herein.

Those of ordinary skill in the art would be capable of selecting appropriate cathode materials for use in embodiments described herein. In some cases, the cathode material may be a hole conducting material. In some cases, the anode material may be substantially transparent. The anode material may be selected to promote electron injection at low voltage, and have effective stability. Examples of cathode materials are described in U.S. Pat. Nos. 4,885,211; 5,059,861; 5,059,862; 5,247,190; 5,703,436; 5,608,287; 5,837,391; 5,677,572; 5,776,622; 5,776,623; 5,714,838; 5,969,474; 5,739,545; 5,981,306; 6,137,223; 6,140,763; 6,172,459; 6,278,236; and 6,284,393; and European Patent No. 1076368. Cathode materials may be formed within the device using known methods, including thermal evaporation, electron beam evaporation, ion sputtering, or chemical vapor deposition. In some cases, the cathode may be patterned using known photolithographic processes.

In some embodiments, the anode may be selected to be substantially transparent opaque, or reflective. In one set of embodiments, the anode may be substantially transparent to the emission generated by the emission later. Examples of transparent anode materials include metal oxides such as indium-tin oxide (ITO), indium-zinc oxide (IZO), tin oxide, aluminum- or indium-doped zinc oxide, magnesium-indium oxide, and nickel-tungsten oxide, metal nitrides such as gallium nitride, metal selenides such as zinc selenide, and metal sulfides such as zinc sulfide. The anode may be formed within the devices using known techniques such as evaporation, sputtering, chemical vapor deposition, or electrochemical techniques. In some cases, the anode may be patterned using known photolithographic processes. In some cases the device can have layers that shift the emission color to create devices that have desirable color in their emission.

The substrate can be any material capable of supporting the device components as described herein. Preferably, the substrate material has a thermal coefficient of expansion similar to those of the other components of the device to promote adhesion and prevent separation of the layers at various temperatures. In some instances, materials with dissimilar thermal expansion coefficients may expand and contract at different rates and amounts with changes in temperature, which can cause stress and delamination of the layers. The substrate can either be light transmissive or opaque, depending on the intended direction of light emission. Examples of appropriate substrate materials may include glass, plastic, semiconductor materials such as silicon, ceramics, and circuit board materials. In some instances, it may be advantageous to have the materials be non-crystalline such that grain boundaries between different crystalline domains do not develop during device formation or during operation of the device.

The term "alkyl" refers to the radical of saturated aliphatic groups, including straight-chain alkyl groups, branched-chain alkyl groups, cycloalkyl (alicyclic) groups, alkyl substituted cycloalkyl groups, and cycloalkyl substituted alkyl groups. The alkyl groups may be optionally substituted, as described more fully below. Examples of alkyl groups include, but are not limited to, methyl, ethyl, propyl, isopropyl, butyl, isobutyl, tert-butyl, 2-ethylhexyl, cyclopropyl, cyclobutyl, cyclopentyl, cyclohexyl, and the like. "Heteroalkyl" groups are alkyl groups wherein at least one atom is a heteroatom (e.g., oxygen, sulfur, nitrogen, phosphorus, etc.), with the remainder of the atoms being carbon atoms. Examples of heteroalkyl groups include, but are not limited to, alkoxy, poly(ethylene glycol)-, alkyl-substituted amino, tetrahydrofuranyl, piperidinyl, morpholinyl, etc. "Fluoroalkyl" groups are alkyl groups wherein at least one hydrogen is replaced with a fluoro group. In some cases, all hydrogen groups of an alkyl group are replaced with fluoro groups to form a fluoroalkyl group (e.g., $CF_3$).

The term "alkoxy" refers to —O-alkyl. A "fluoroalkoxy" group refers to —O— fluoroalkyl.

The terms "alkenyl" and "alkynyl" refer to unsaturated aliphatic groups analogous to the alkyl groups described above, but containing at least one double or triple bond respectively. The "heteroalkenyl" and "heteroalkynyl" refer to alkenyl and alkynyl groups as described herein in which one or more atoms is a heteroatom (e.g., oxygen, nitrogen, sulfur, and the like).

The term "aryl" refers to an aromatic carbocyclic group having a single ring (e.g., phenyl), multiple rings (e.g., biphenyl), or multiple fused rings in which at least one is aromatic (e.g., 1,2,3,4-tetrahydronaphthyl, naphthyl, anthryl, or phenanthryl), all optionally substituted. "Fluoroaryl" groups are aryl groups that are substituted with at least one fluoro group.

The terms "amine" and "amino" refer to both unsubstituted and substituted amines, e.g., a moiety that can be represented by the general formula: N(R')(R")(R''') wherein R', R", and R'"each independently represent a group permitted by the rules of valence.

The terms "acyl," "carboxyl group," or "carbonyl group" are recognized in the art and can include such moieties as can be represented by the general formula:

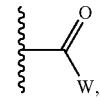

wherein W is H, OH, O-alkyl, O-alkenyl, or a salt thereof. Where W is O-alkyl, the formula represents an "ester." Where W is OH, the formula represents a "carboxylic acid."

In general, where the oxygen atom of the above formula is replaced by sulfur, the formula represents a "thiolcarbonyl" group. Where W is a S-alkyl, the formula represents a "thiolester." Where W is SH, the formula represents a "thiolcarboxylic acid." On the other hand, where W is alkyl, aryl, or another carbon-containing substituent, the above formula represents a "ketone" group. Where W is hydrogen, the above formula represents an "aldehyde" group.

The terms "electron-withdrawing group," "electron-deficient group," and "electron-poor group" are recognized in the art and as used herein refer to a functionality which draws electrons to itself more than a hydrogen atom would at the same position. Examples of electron-withdrawing groups include carbonyl groups (e.g., ketone, esters, aldehydes), sulfonyl, fluoro, trifluoromethyl, nitro, cyano, and the like.

The terms "electron-donating group" and "electron-rich group" as used herein refer to a functionality which draws electrons to itself less than a hydrogen atom would at the same position. Exemplary electron-donating groups include amino, hydroxy, alkoxy, acylamino, acyloxy, alkyl, halides, and the like.

As used herein, the term "heterocycle" or "heterocyclyl" refers to a monocyclic or polycyclic heterocyclic ring that is either a saturated ring or an unsaturated non-aromatic ring. Typically, the heterocycle may include 3-membered to 14-membered rings. In some cases, 3-membered heterocycle can contain up to 3 heteroatoms, and a 4- to 14-membered heterocycle can contain from 1 to about 8 heteroatoms. Each heteroatom can be independently selected from nitrogen, which can be quaternized; oxygen; and sulfur, including sulfoxide and sulfone. The heterocycle may be attached via any heteroatom ring atom or carbon ring atom. Representative heterocycles include morpholinyl, thiomorpholinyl, pyrrolidinonyl, pyrrolidinyl, piperidinyl, piperazinyl, hydantoinyl, valerolactamyl, oxiranyl, oxetanyl, tetrahydrofuranyl, tetrahydropyranyl, tetrahydropyrindinyl, tetrahydropyrimidinyl, tetrahydrothiophenyl, tetrahydrothiopyranyl, and the like. A heteroatom may be substituted with a protecting group known to those of ordinary skill in the art, for example, the hydrogen on a nitrogen may be substituted with a tert-butoxycarbonyl group. Furthermore, the heterocyclyl may be optionally substituted with one or more substituents (including without limitation a halogen atom, an alkyl radical, or aryl radical). Only stable isomers of such substituted heterocyclic groups are contemplated in this definition.

As used herein, the term "heteroaromatic" or "heteroaryl" means a monocyclic or polycyclic heteroaromatic ring (or radical thereof) comprising carbon atom ring members and one or more heteroatom ring members (such as, for example, oxygen, sulfur or nitrogen). Typically, the heteroaromatic ring has from 5 to about 8 ring members in which at least 1 ring member is a heteroatom selected from oxygen, sulfur, and nitrogen. In another embodiment, the heteroaromatic ring is a 5 or 6 membered ring and may contain from 1 to about 4 heteroatoms. In another embodiment, the heteroaromatic ring system has a 7 to 8 ring members and may contain from 1 to about 6 heteroatoms. Representative heteroaryls include pyridyl, furyl, thienyl, pyrrolyl, oxazolyl, imidazolyl, indolizinyl, thiazolyl, isoxazolyl, pyrazolyl, isothiazolyl, pyridazinyl, pyrimidinyl, pyrazinyl, triazinyl, triazolyl, pyridinyl, thiadiazolyl, pyrazinyl, quinolyl, isoquniolyl, indazolyl, benzoxazolyl, benzofuryl, benzothiazolyl, indolizinyl, imidazopyridinyl, isothiazolyl, tetrazolyl, benzimidazolyl, benzoxazolyl, benzothiazolyl, benzothiadiazolyl, benzoxadiazolyl, carbazolyl, indolyl, tetrahydroindolyl, azaindolyl, imidazopyridyl, qunizaolinyl, purinyl, pyrrolo[2,3]pyrimidyl, pyrazolo[3,4]pyrimidyl, benzo(b)thienyl, and the like. These heteroaryl groups may be optionally substituted with one or more substituents.

Suitable substituents for various groups described herein, e.g., alkyl, alkoxy, alkyl sulfanyl, alkylamino, dialkylamino, alkylene, alkenyl, alkynyl, cycloalkyl, cycloalkenyl, heterocyclyl, aryl, aralkyl, heteroaryl, and heteroarylalkyl groups, include any substituent that will form a stable compound. Examples of substituents include alkyl, alkoxy, alkyl sulfanyl, alkylamino, dialkylamino, alkenyl, alkynyl, cycloalkyl, an cycloalkenyl, an heterocyclyl, an aryl, an heteroaryl, an aralkyl, an heteroaralkyl, a haloalkyl, —C(O)NR$^a$R$^b$, —NR$^c$C(O)R$^d$, halo, —OR$^c$, cyano, nitro, haloalkoxy, —C(O)R$^c$, —NR$^a$R$^b$, —SR$^c$, —C(O)OR$^c$, —OC(O)R$^c$, —NR$^c$C(O)NR$^a$R$^b$, OC(O)NR$^a$R$^b$, NR$^c$C(O)OR$^d$, S(O)$_p$R$^c$, or —S(O)$_p$NR$^a$R$^b$, wherein R$^a$ and R$^b$, for each occurrence are, independently, H, an optionally substituted alkyl, an optionally substituted alkenyl, an optionally substituted alkynyl, an optionally substituted cycloalkyl, an optionally substituted cycloalkenyl, an optionally substituted heterocyclyl, an optionally substituted aryl, an optionally substituted heteroaryl, an optionally substituted aralkyl, or an optionally substituted heteroaralkyl; or R$^a$ and R$^b$ taken together with the nitrogen to which they are attached form optionally substituted heterocyclyl or optionally substituted heteroaryl; and R$^c$ and R$^d$ for each occurrence are, independently, H, an optionally substituted alkyl, an optionally substituted alkenyl, an optionally substituted alkynyl, an optionally substituted cycloalkyl, an optionally substituted cycloalkenyl, an optionally substituted heterocyclyl, an optionally substituted aryl, an optionally substituted heteroaryl, an optionally substituted aralkyl, or an optionally substituted heteroaralkyl. In addition, alkyl, cycloalkyl, alkylene, heterocyclyl, and any saturated portion of a alkenyl, cycloalkenyl, alkynyl, aralkyl, or heteroaralkyl group, may also be substituted with =O, =S, or =NR$^c$.

Choices and combinations of substituents and variables envisioned by embodiments described herein are only those that result in the formation of stable compounds. The term "stable" refers to compounds which possess stability sufficient to allow manufacture and which maintains the integrity of the compound for a sufficient period of time to be useful for the purposes detailed herein (e.g., incorporation within devices such as OLEDs). Typically, such compounds are stable at a temperature of 40° C. or less, in the absence of excessive moisture, for at least one week. Such choices and combinations will be apparent to those of ordinary skill in the art and may be determined without undue experimentation.

Unless indicated otherwise, the compounds described herein containing reactive functional groups (such as, without limitation, carboxy, hydroxy, and amino moieties) also include protected derivatives thereof. "Protected derivatives" are those compounds in which a reactive site or sites are blocked with one or more protecting groups. Suitable protecting groups for carboxy moieties include benzyl, tert-butyl, and the like. Suitable protecting groups for amino and amido groups include acetyl, tert-butoxycarbonyl, benzyloxycarbonyl, and the like. Suitable protecting groups for hydroxy include benzyl and the like. Other suitable protecting groups are well known to those of ordinary skill in the art and include those found in T. W. Greene, PROTECTING GROUPS IN ORGANIC SYNTHESIS, John Wiley & Sons, Inc. 1981, the entire teachings of which are incorporated herein by reference for all purposes.

Compounds described herein may also be in salt form. Illustrative salts include, but are not limited, to sulfate, citrate, acetate, oxalate, chloride, bromide, iodide, nitrate, bisulfate, phosphate, acid phosphate, isonicotinate, lactate, salicylate, acid citrate, tartrate, oleate, tannate, pantothenate, bitartrate, ascorbate, succinate, maleate, gentisinate, fumarate, gluconate, glucaronate, saccharate, formate, benzoate, glutamate, methanesulfonate, ethanesulfonate, benzenesulfonate, p-toluenesulfonate, and pamoate (i.e., 1,1' methylene bis (2 hydroxy 3 naphthoate)) salts. In some cases, the salt may be formed from a compound described herein having an acidic functional group, such as a carboxylic acid functional group, and an inorganic or organic base. Suitable bases include, but are not limited to, hydroxides of alkali metals such as sodium, potassium, and lithium; hydroxides of alkaline earth metal such as calcium and magnesium; hydroxides of other metals, such as aluminum and zinc; ammonia, and organic amines, such as unsubstituted or hydroxy substituted mono, di, or trialkylamines; dicyclohexylamine; tributyl amine; pyridine; N methyl, N ethylamine; diethylamine; triethylamine; mono, bis, or tris (2 hydroxy lower alkyl amines), such as mono, bis, or tris (2 hydroxyethyl)-amine, 2 hydroxy tert butylamine, or tris (hydroxymethyl)methylamine, N, N, di lower alkyl N (hydroxy lower alkyl) amines, such as N,N dimethyl N (2 hydroxyethyl)-amine, or tri (2 hydroxyethyl)amine; N methyl D glucamine; and amino acids such as arginine, lysine, and the like.

In some cases, the salt may be prepared from a compound described herein having a basic functional group, such as an amino functional group, and an inorganic or organic acid. Suitable acids include, but are not limited to, hydrogen sulfate, citric acid, acetic acid, oxalic acid, hydrochloric acid, hydrogen bromide, hydrogen iodide, nitric acid, phosphoric acid, isonicotinic acid, lactic acid, salicylic acid, tartaric acid, ascorbic acid, succinic acid, maleic acid, besylic acid, fumaric acid, gluconic acid, glucaronic acid, saccharic acid, formic acid, benzoic acid, glutamic acid, methanesulfonic acid, ethanesulfonic acid, benzenesulfonic acid, and p-toluenesulfonic acid.

EXAMPLES AND EMBODIMENTS

Example 1

Figure 2C:
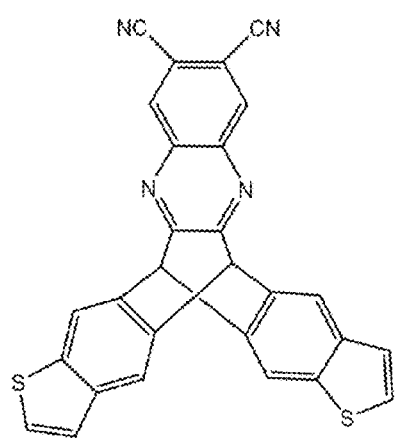
FIGS. 2C-2E shows examples of bridged bicyclic compounds, including [2.2.2] bridged bicycle compounds, according to one set of embodiments.
Figure 2C:
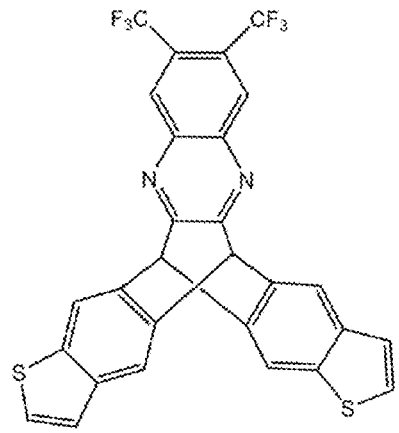
Figure 2C:
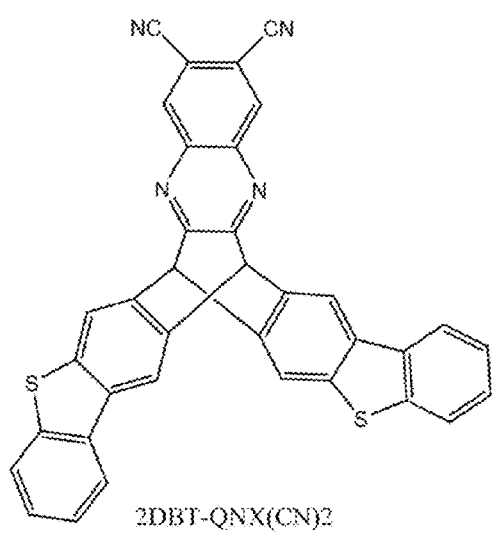
Figure 2C:
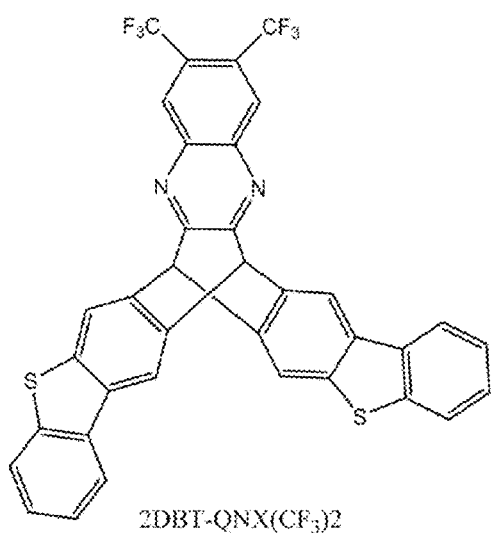
Figure 2D:
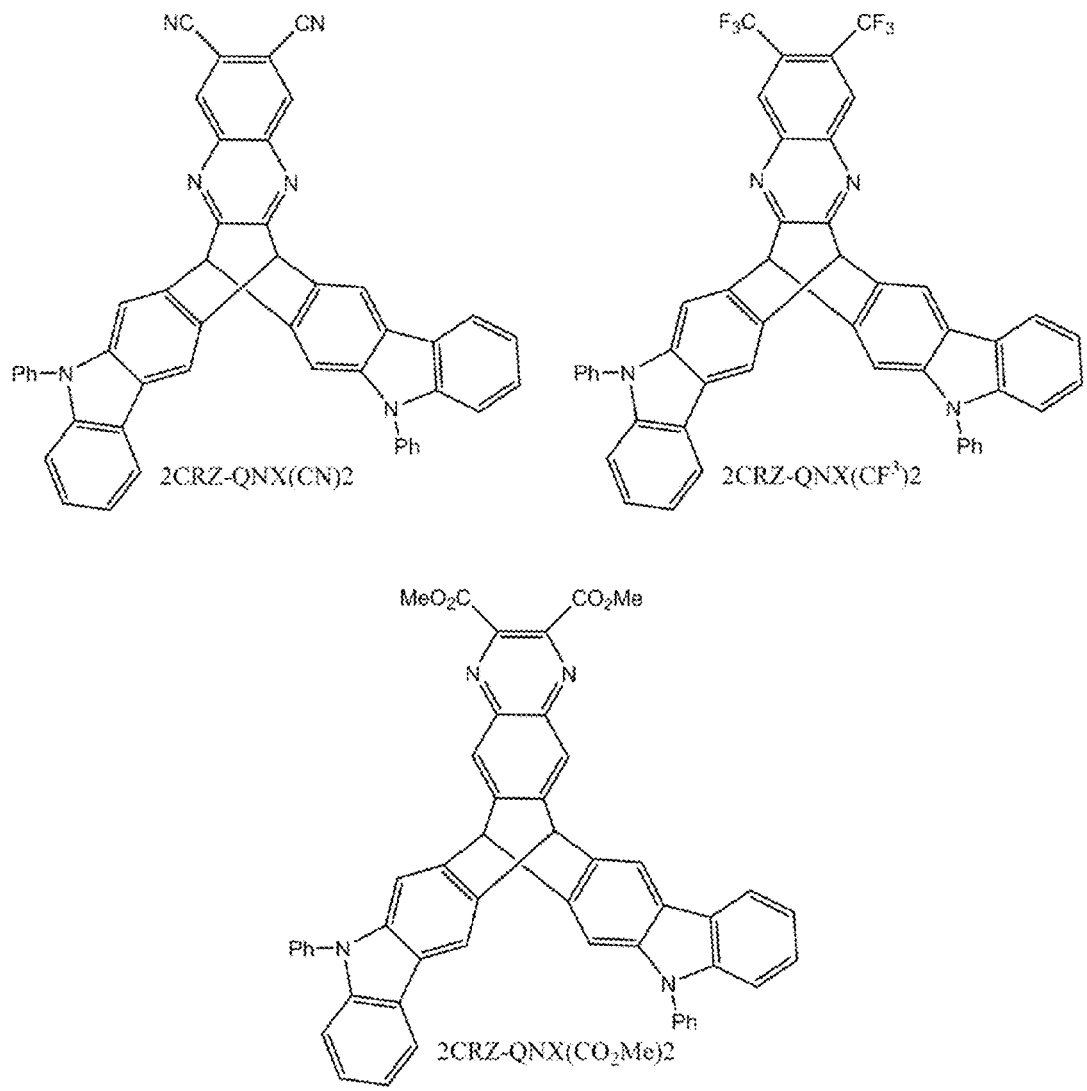
Figure 2E:
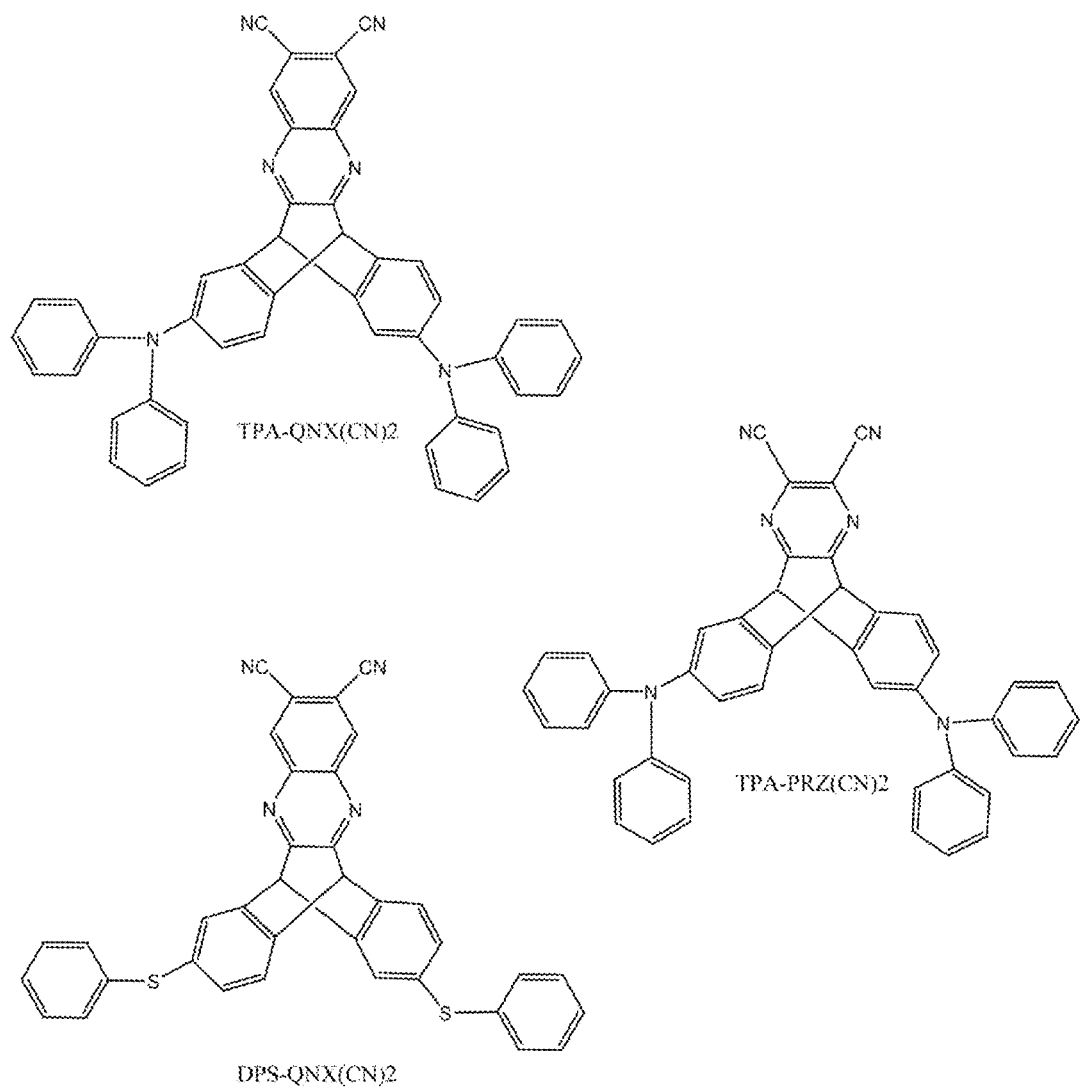

The following example demonstrates the TD-DFT calculation results using ground state optimized geometries (B3LYP/6-31G*, gas phase) of various bridged bicyclic compounds, shown in FIGS. 2C-2E. Results are shown in Table 1.

TABLE 1

| Structure | HOMO (eV) | LUMO (eV) | $S_1$ (eV) | $T_1$ (eV) | $\Delta E_{ST}$ (eV) | f |
|---|---|---|---|---|---|---|
| 2BT-QNX(CN)2 | −6.30 | −2.71 | 3.11 | 2.80 | 0.311 | 0.006 |
| 2BT-QNX(CF$_3$)2 | −6.17 | −2.32 | 3.36 | 3.00 | 0.377 | 0.011 |
| 2DBT-QNX(CN)2 | −6.10 | −2.73 | 2.94 | 2.76 | 0.182 | 0.144 |
| 2DBT-QNX(CF$_3$)2 | −5.98 | −2.35 | 3.19 | 2.96 | 0.228 | 0.137 |
| 2CRZ-QNX(CN)2 | −5.59 | −2.50 | 2.67 | 2.51 | 0.160 | 0.121 |
| 2CRZ-QNX(CF$_3$)2 | −5.48 | −2.13 | 2.90 | 2.71 | 0.190 | 0.115 |
| 2CRZ-QNX(CO$_2$Me)2 | −5.32 | −2.04 | 2.89 | 2.74 | 0.155 | 0.109 |
| TPA-QNX(CN)2 | −5.22 | −2.57 | 2.25 | 2.14 | 0.111 | 0.084 |
| TPA-PRZ(CN)2 | −5.22 | −2.48 | 2.35 | 2.25 | 0.075 | 0.008 |
| DPS-QNX(CN)2 | −5.93 | −2.64 | 2.86 | 2.69 | 0.174 | 0.149 |

Example 2

The following example described the synthesis of an exemplary bicyclic compound, 2BT-QNX(CN)2.

Synthesis steps for 2BT-QNX(CN2) are illustrated in FIG. 3. Diketone precursor was synthesized by modified method of a previously reported procedure.

Example 2-1

The following example describes the synthesis of 5,11-dihydro-5,11-[4,5]epidioxoloanthra[2,3-b:6,7-b']dithiophen-15-one (Diels-Alder product).

A mixture of ADT (250 mg 0.86 mmol) and vinylene carbonate (1 mL, 15.8 mmol) in xylene (5 mL) was heated 180° C. using microwave irradiation under $N_2$ for 8 h. The reaction mixture was cooled to room temperature then solvent was removed under vacuum condition. The residue was purified by silica gel column chromatography using CHCl$_3$ as eluent. Diels-Alder product (256 mg, 0.68 mmol, 79% yield) was obtained as colorless solid.

Example 2-2

The following example describes the synthesis of 5,11-dihydro-5,11-ethanoanthra[2,3-b:6,7-b']dithiophene-13,14-dione (Diketone precursor).

To a solution of Diels-Alder product in Example 2-1 (200 mg, 0.53 mmol) in THF (9 mL) was added 4 M NaOH aq. (2.4 mL) and the mixture was refluxed for 2 h using oil bath. The reaction mixture was cooled to room temperature, poured into water and extracted with CH$_2$Cl$_2$. The combined organic layer was washed with water and brine over MgSO$_4$. The solvent was removed under reduced pressure. The residue (diol) was used without purification.

Trifluoroacetic anhydride (1.4 mL, 20 mmol) was added dropwise to a mixture of dry-DMSO (1.4 mL, 252 mmol) and CH$_2$Cl$_2$ (5.0 mL) at −78° C. under $N_2$. After stirring for 10 min, solution of diol in dry-DMSO/CH$_2$Cl$_2$ (3.0 mL/3.0 mL) was added dropwise. After stirring −78° C. for 90 min, N,N-diisopropylethylamine (3.5 mL, 20 mmol) was added dropwise to the reaction mixture. The mixture was stirred at −78° C. for 60 min and warmed to room temperature. 1 M HCl aq. was added. The organic layer was extracted with CH$_2$Cl$_2$, washed with water and brine, and dried with MgSO$_4$. After removal of the solvent in vacuo, the residue was purified by silica gel column chromatography with CH$_2$Cl$_2$ to give diketone precursor as yellow solid (128 mg, 0.37 mmol, 70% yield 2 steps).

Example 2-3

The following example describes the synthesis of 2BT-QNX(CN)2.

A solution of diketone (35 mg 0.1 mmol) and 4,5-diaminophthalonitrile (16 mg, 0.1 mmol) in ethanol/acetic acid (5 mL, 49/1) was refluxed for 1 h using oil bath then pale yellow crystal was appeared. After the reaction mixture was cooled to room, the crystal was collected by filtration and dried under reduce pressure to obtain 2BT-QNX(CN)2 (46 mg, 98% yield).

Example 3

This example demonstrates the photoluminescent properties of exemplary bicyclic compound, 2BT-QNX(CN)2.

Figure 5:
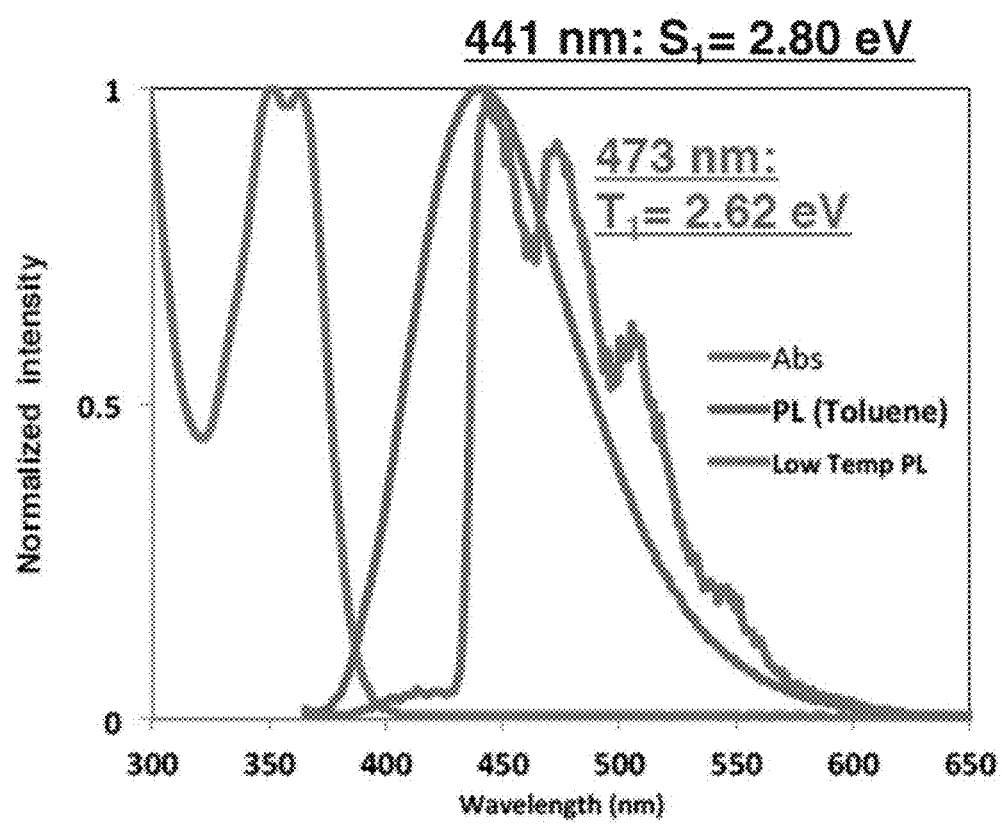
FIG. 5 shows a plot of the spectra for an exemplary bridged bicyclic compound, according to one set of embodiments.

FIG. 5 shows UV-Vis absorption, fluorescence and phosphorescence (at 77 K) spectra of 2BT-QNX(CN)2 in toluene. Absorption maxima were observed in 351 nm and 363 nm. $\Delta E_{ST}$ of 2BT-QNX(CN)2 was determined $\Delta E_{ST}$=0.18 eV from fluorescence maxima (441 nm: $S_1$=2.80 eV) at room temperature and phosphorescence maxima (473 nm: $T_1$=2.62 eV) at 77 K respectively.

Figure 6A:
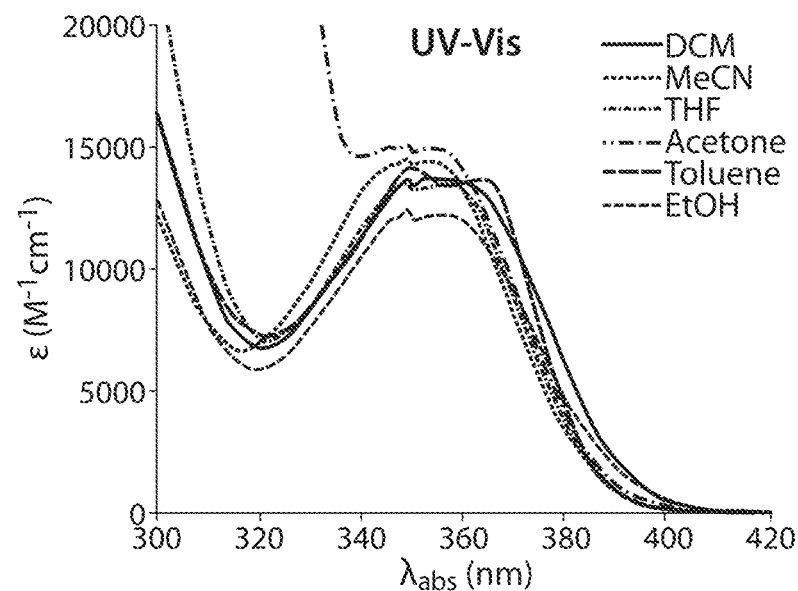
FIGS. 6A-6B show plots of the spectra and emissions for an exemplary bridged bicyclic compound, according to one set of embodiments.
Figure 6B:
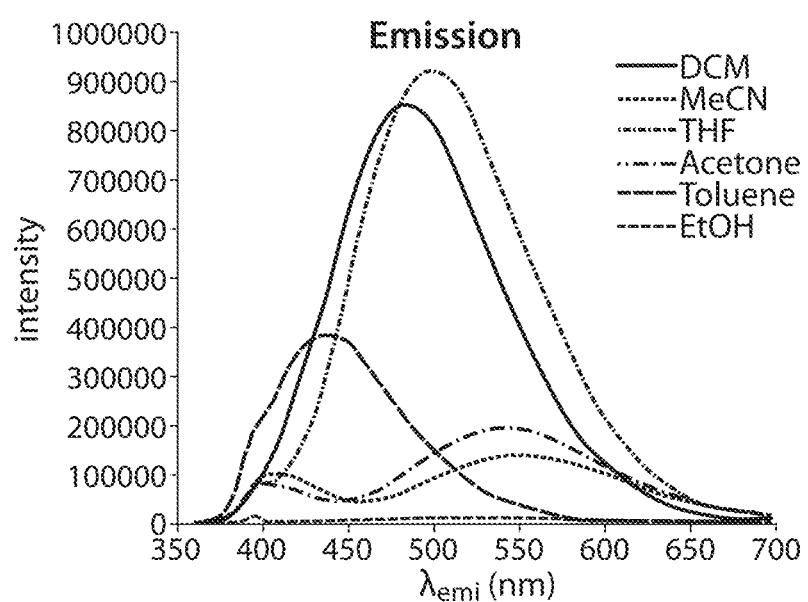

FIGS. 6A-B depict (A) UV-Vis absorption and (B) fluorescence spectra in various solutions (e.g., solvents), and photophysical properties are summarized in Table 2. The absorption bands are observed in the range of 340~360 nm with similar intensity (E=1.1-1.5×10$^4$ M$^{-1}$ cm$^{-1}$) in any solvent (FIG. 6A). Conversely, significant fluorescence solvatochromism depending on solvent polarities was observed (FIG. 6B). Higher solvent polarities exhibit more red-shifted fluorescence. The fluorescence of nonpolar toluene solution emitted blue light ($\lambda_{max}$=441 nm), the solutions of moderately polar DCM ($\lambda_{max}$=480 nm) and THF ($\lambda_{max}$=497 nm) were greenish blue and the solutions of highly polar acetone ($\lambda_{max}$=539 nm) and acetonitrile ($\lambda_{max}$=545 nm) produced orange color light. These results suggested that the triptycene aggregate to form several types of excimer or exciplex. In the case of ethanol solution the fluorescence was quenched because the triptycene might aggregate tightly.

TABLE 2

| Solvent | $\lambda_{abs}$ (nm) | $\varepsilon \times 10^4$ (M$^{-1}$cm$^{-1}$) | $\lambda_{emi}$ (nm) | $\Phi^a$ | $\tau$ (ns)$^a$ |
|---|---|---|---|---|---|
| Toluene | 351, 363 | 1.4 | 441 | 0.04 | 2.64 |
| DCM | 354 | 1.4 | 480 | 0.10 | — |
| THF | 356 | 1.3 | 497 | 0.13 | — |
| Acetone | 354 | 1.5 | 401, 539 | 0.02 | — |
| Acetonitrile | 353 | 1.4 | 407, 545 | 0.10 | — |
| Ethanol | 356 | 1.2 | nd | nd | — |

$^a$POPOP was used as a standard.

Figure 7A:
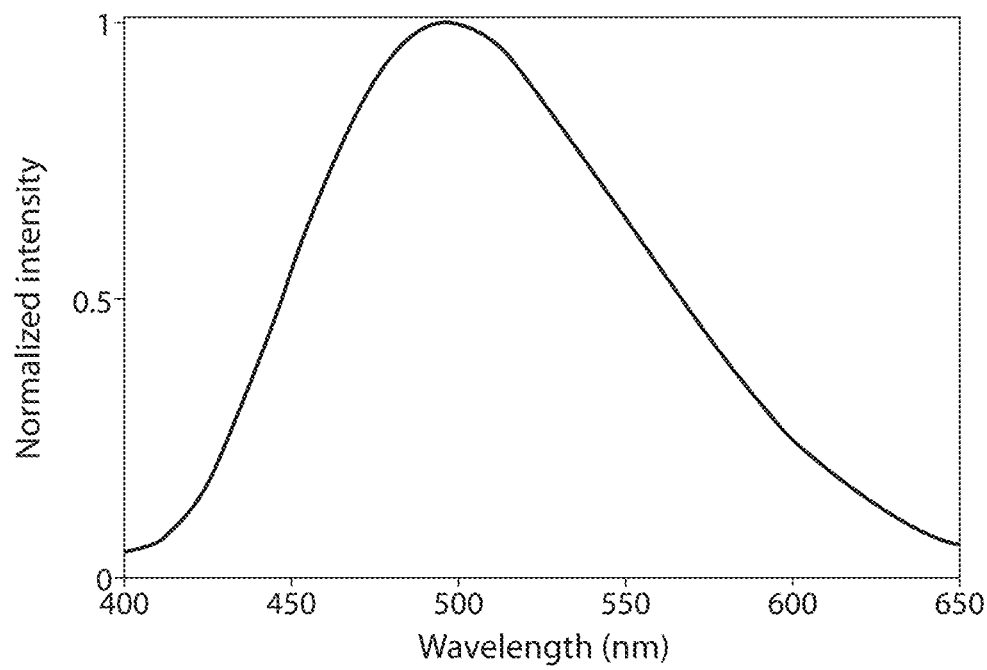
FIGS. 7A-7B show plots of the spectra for an exemplary bridged bicycle compound, according to one set of embodiments.
Figure 7B:
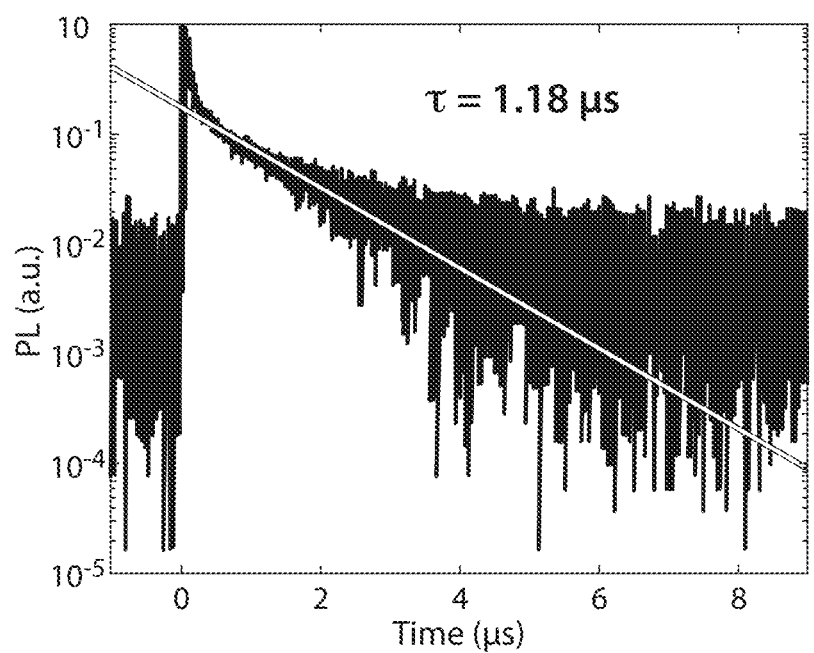

A thin neat film of 2BT-QNX(CN)2 (20 nm) was prepared by vacuum deposition on glass plate to exam solid state photoluminescence studies. Observed greenish blue color fluorescence ($\lambda_{max}$=496 nm) of the film was similar as solution fluorescence in DCM and in THF and suggests some aggregation of the triptycene in sold state (FIG. 7A). Transition photoluminescence study of the 2BT-QNX(CN)2 film showed microsecond order of emission life time ($\tau$=1.18 as, FIG. 7B).

Example 4

This example demonstrates the properties of a device comprising exemplary bicyclic compound, 2BT-QNX(CN)2, in an emitter layer.

Figure 9A:
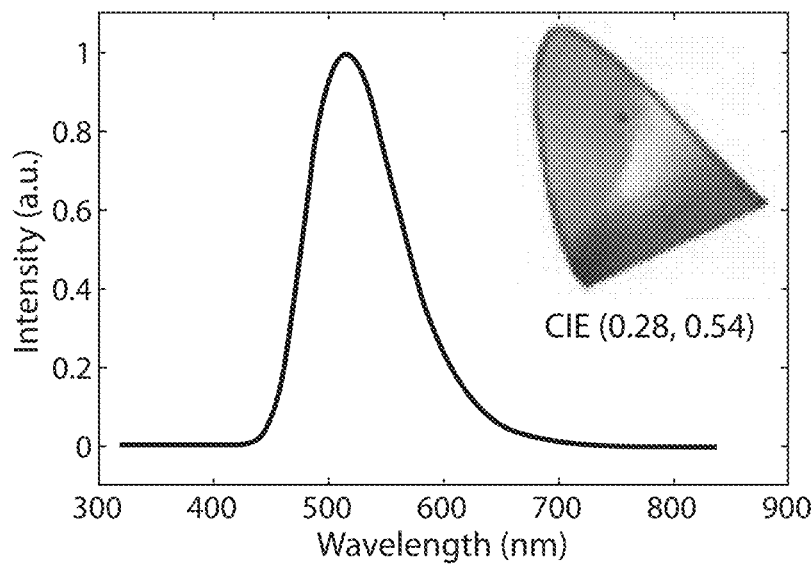
FIGS. 9A-9B shows plots of electroluminescence and external quantum efficiency of an exemplary bridged bicycle compound, according to one set of embodiments.
Figure 9B:
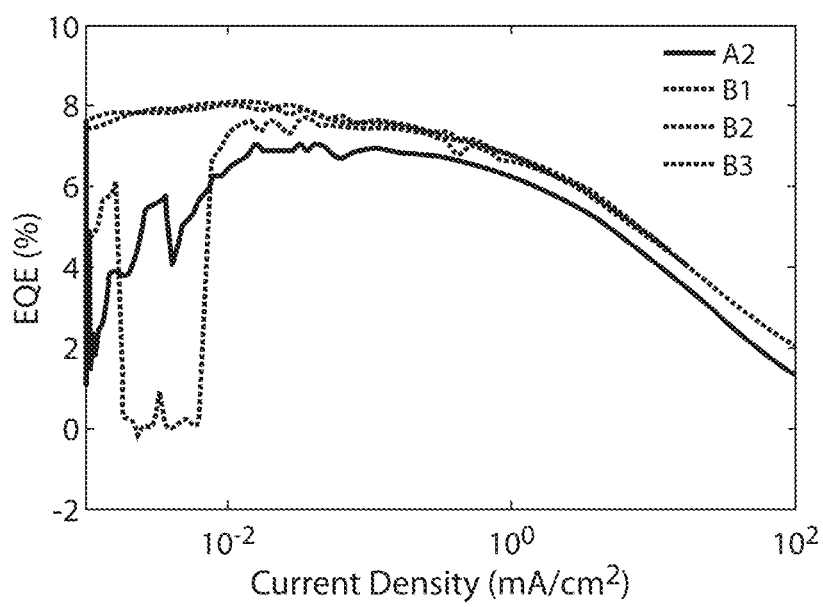

Electroluminescence properties of 2BT-QNX(CN)2 as emitter was examined using ITO/MoO$_3$ (5 nM)/TcTa (30 nm)/emitter layer (30 nm)/TmPyPb (40 nm)/LiF (0.8 nm)/Al (as shown in FIG. 8). 2BT-QNX(CN)2 was doped into mCP (e.g., as the host material) in this device at about 10 wt. % 2BT-QNX(CN)2 as the emitter layer. TcTA, TmPyPb and mCP are Tris(4-carbazoyl-9-ylphenyl)amine, 1,3,5-Tri(m-pyridin-3-ylphenyl)benzene and 1,3-Bis(N-carbazolyl)benzene respectively. The OLED device exhibited greenish-blue color ($\lambda_{max}$=517 nm, CIE (0.28, 0.58)) electroluminescence and had an external quantum efficiency (EQE) of 8% (FIGS. 9A-B).

Example 5

This example demonstrates the x-ray crystallography of exemplary bicyclic compound, 2BT-QNX(CN)2.

Figure 10:
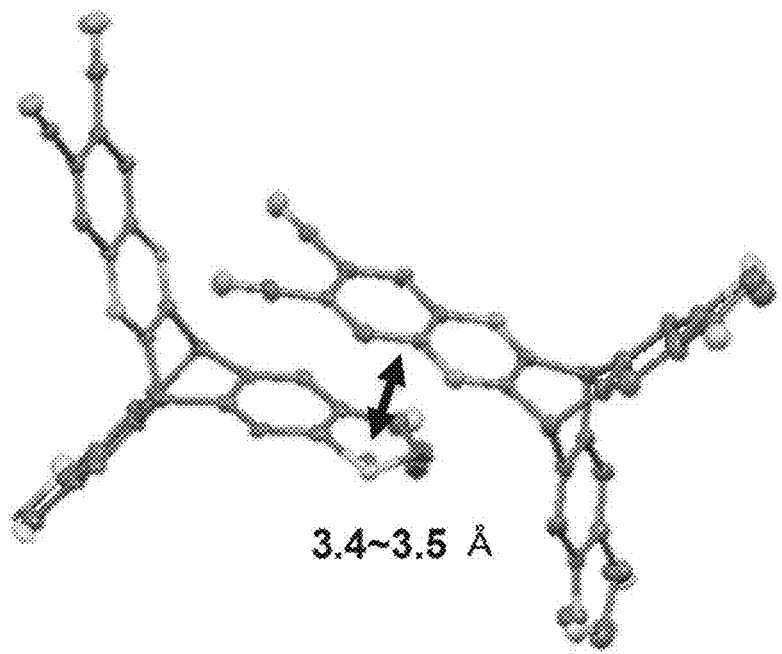
FIG. 10 shows the interaction between two bridged bicyclic compounds, according to one set of embodiments.
Figure 10:
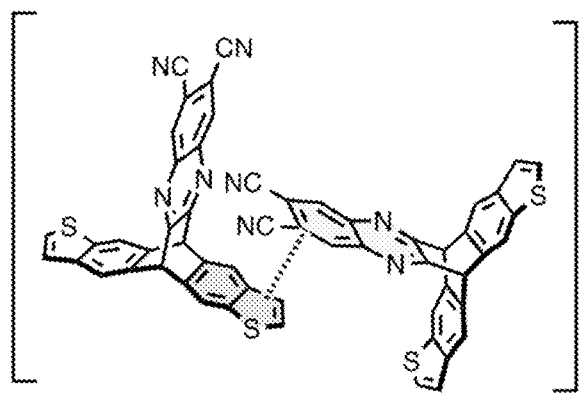

X-ray crystallography of 2BT-QNX(CN)2 using the crystal prepared in the solution of chloroform/methanol realized π-stacked dimer structure suggested the donor/acceptor interaction of benzothiophene and quinoxaline with 3.4 Å as the shortest contact distance (FIG. 10). This crystal may have insoluble disorder due to the existence of the enantiomer. DFT calculations were performed using the crystal structure to estimate the binding energy of the donor/acceptor complex, and TD-DFT calculations were employed to estimate the properties of the complex excited states. The binding energy was 13.2 kcal/mol (B3LYP-D3/6-31G* gas phase). The energy of singlet excited state $S_1$=2.59 eV (=479 nm) was larger than the estimated one from fluorescence maximum wavelength of thin neat film ($\lambda_{max}$=496 nm=2.50 eV). The energy gap between $S_1$ and $T_1$ of the donor/acceptor complex ($\Delta E_{ST}$=0.14 eV) was smaller than the energy gap of the monomer triptycene.

Example 6

The following example demonstrates the properties of devices including the bridged bicyclic compounds, as described herein.

Figure 11A:
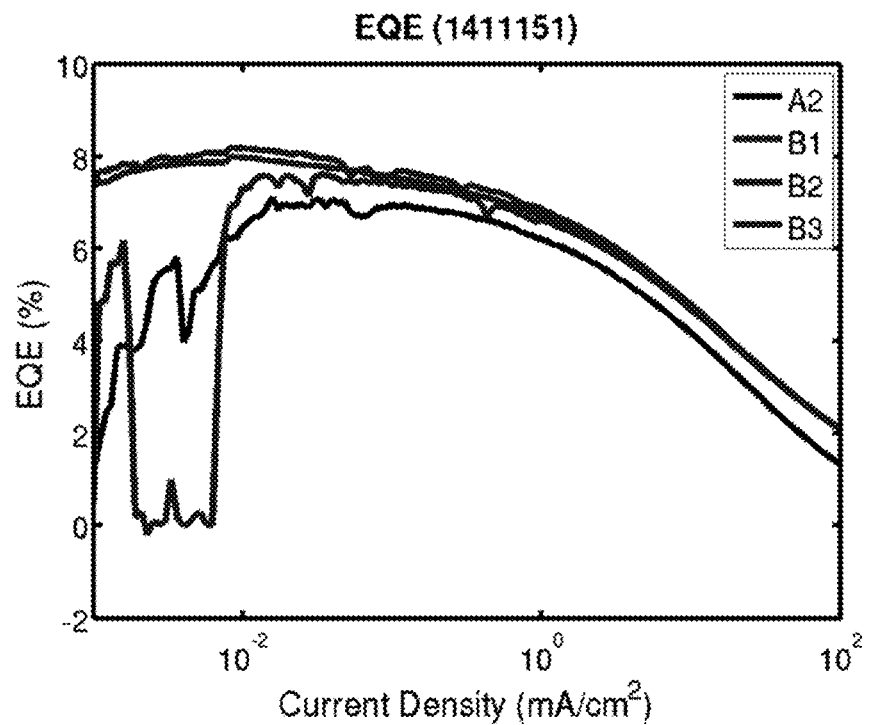
FIGS. 11A-11B show plots of the (A) EQE and (B) peak emissions for a device, according to one set of embodiments.
Figure 11B:
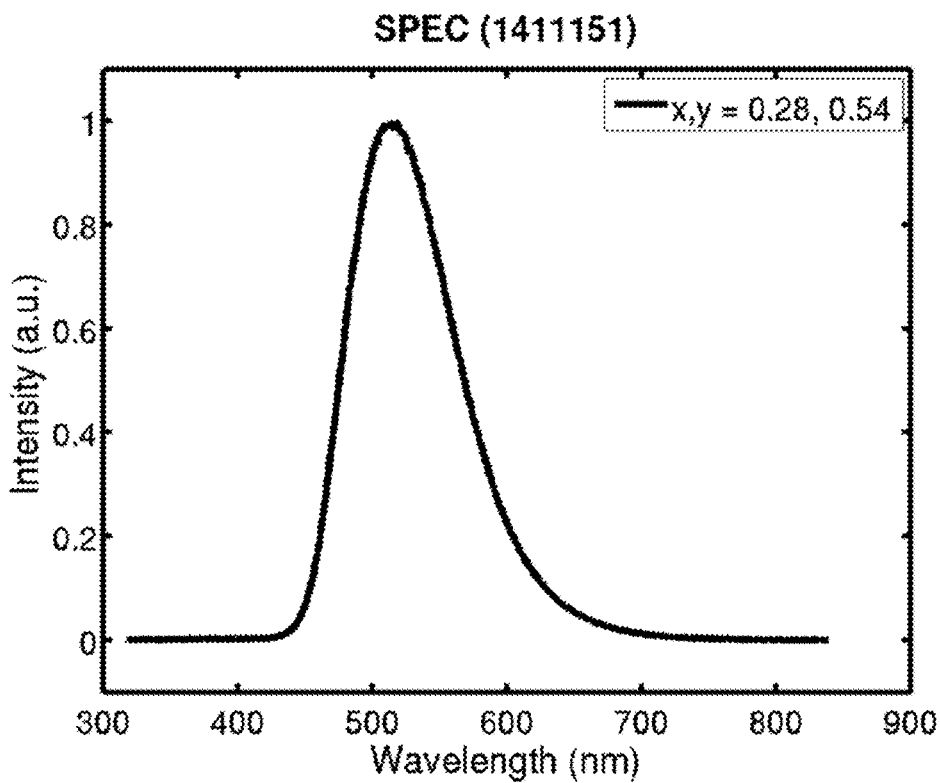

A device having the configuration as illustrated in FIG. 8, where the emissive layer comprised 5 wt % 2BT-QNX(CN2) and 95 wt % mCP, had an EQE of 8% and a peak emission wavelength of 517.3 nm. Peak wavelength and EQE for this device are shown in FIGS. 11A-B.

Figure 12A:
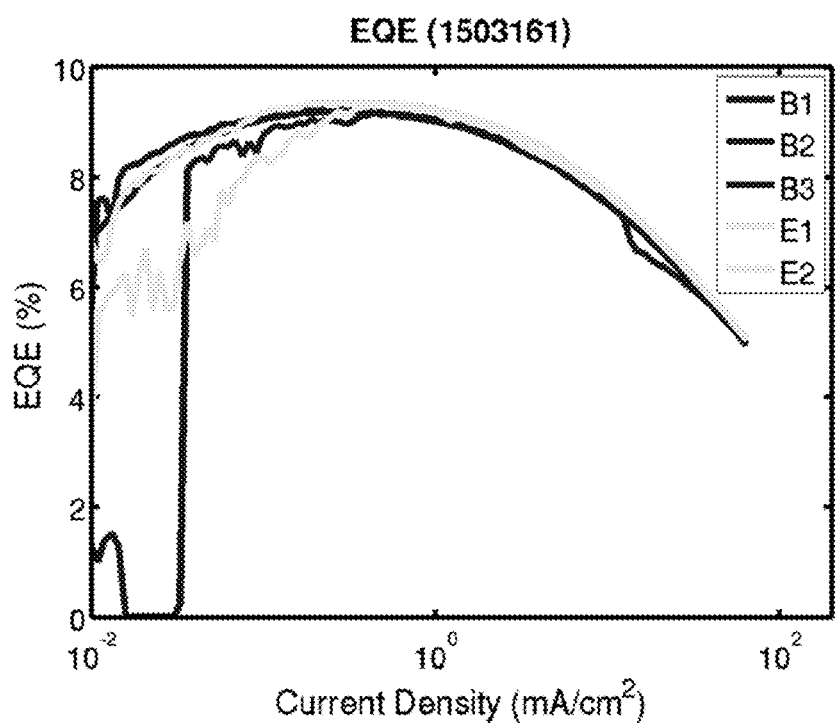
FIGS. 12A-12B show plots of the (A) EQE and (B) peak emissions for a device, according to one set of embodiments.
Figure 12B:
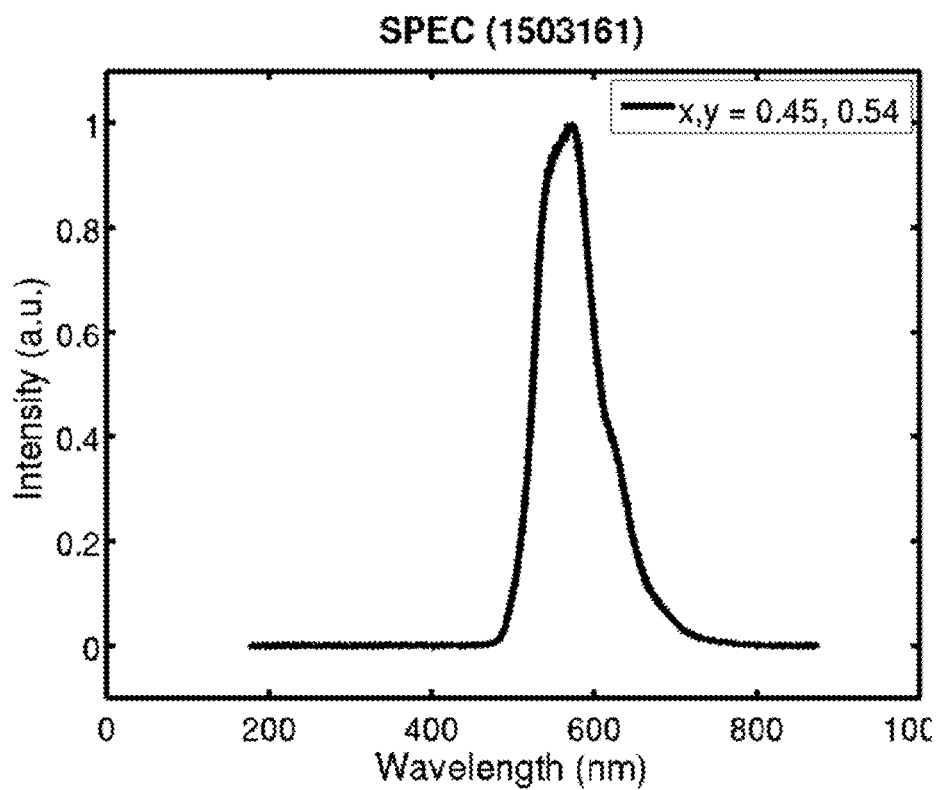

A device having the configuration as illustrated in FIG. 8, where the emissive layer comprised 10 wt % TPA-QNX(CN)2 and 90 wt % mCP, had an EQE of 9.37% and a peak emission wavelength of 569.5 nm. Peak wavelength and EQE for this device are shown in FIGS. 12A-B.

Figure 13A:
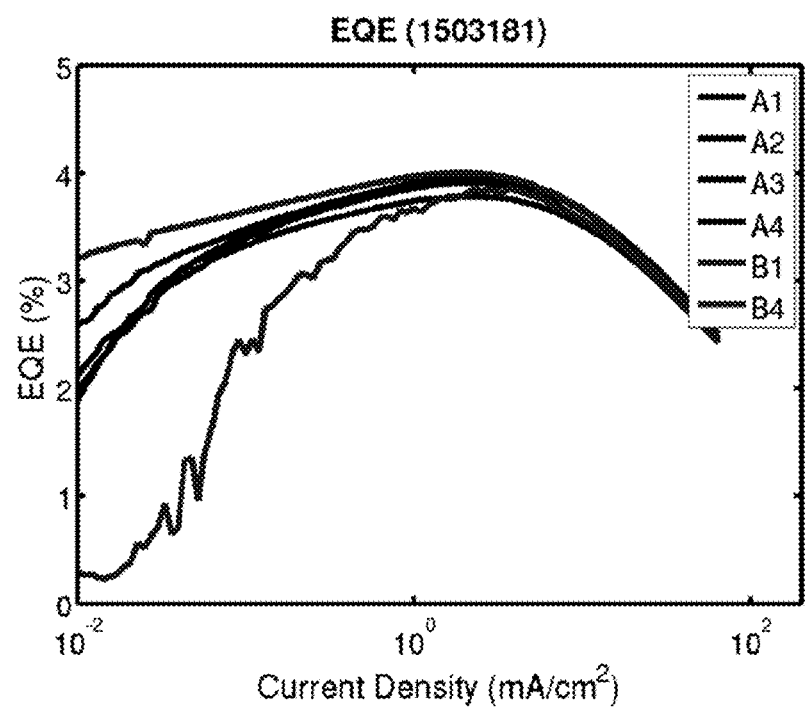
FIGS. 13A-13B show plots of the (A) EQE and (B) peak emissions for a device, according to one set of embodiments.
Figure 13B:
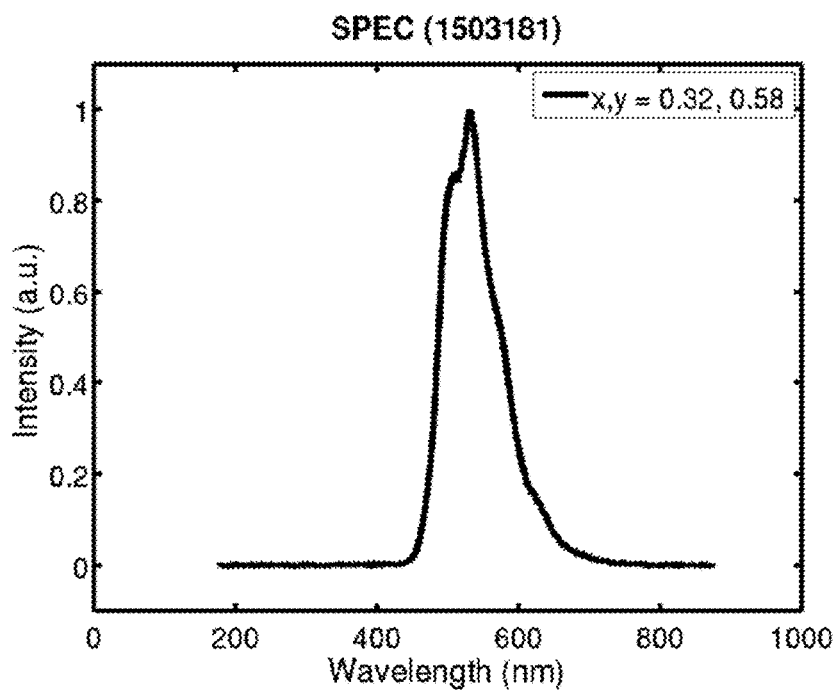

A device having the configuration as illustrated in FIG. 8, where the emissive layer comprised 10 wt % DPS-QNX(CN)2 and 90 wt % mCP, had an EQE of 4% and a peak emission wavelength of 531.2 nm. Peak wavelength and EQE for this device are shown in FIGS. 13A-B.

Figure 14A:
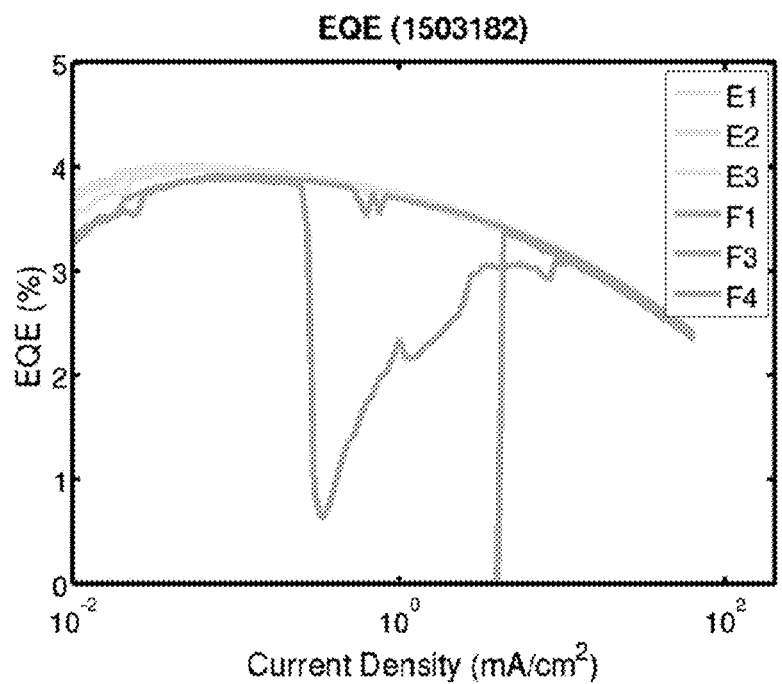
FIGS. 14A-14B show plots of the (A) EQE and (B) peak emissions for a device, according to one set of embodiments.
Figure 14B:
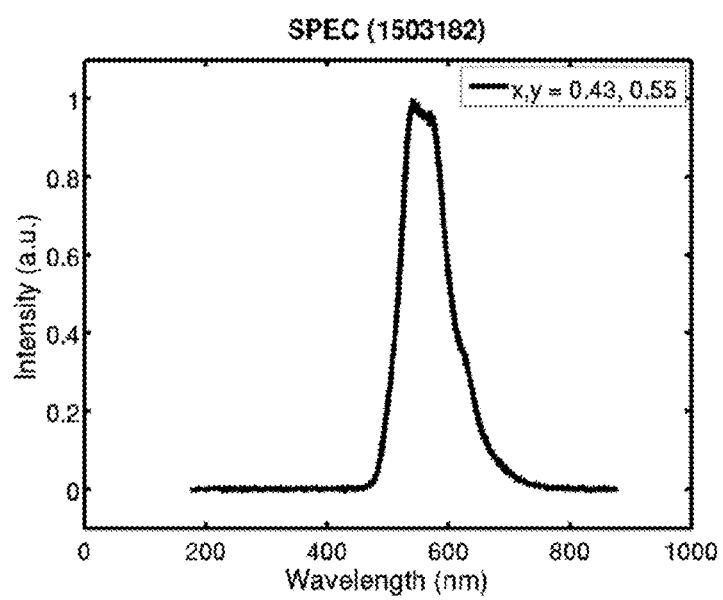

A device having the configuration as illustrated in FIG. 8, where the emissive layer comprised 10 wt % TPA-PRZ(CN)2 and 90 wt % mCP, had an EQE of 9.37% and a peak emission wavelength of 550 nm. Peak wavelength and EQE for this device are shown in FIGS. 14A-B.

Having thus described several aspects of some embodiments of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed:
1. A composition, comprising:
a [2.2.Z] bridged bicyclic compound comprising a structure as in Formula (I):

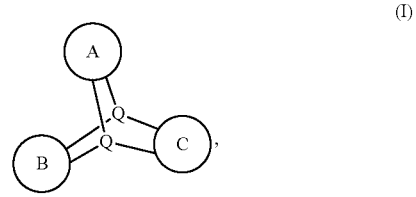

wherein:

each Q is the same or different and a tetrahedral bridgehead group, at least two of A, B, and C are the same or different and include a pi-electron group, Z is 1 or 2, at least one of the pi-electron groups is an electron donating group comprising an optionally substituted carbocyclyl or optionally substituted heteroaryl moiety rigidly bonded to the tetrahedral bridgehead group, at least one of the pi-electron groups is an electron accepting group comprising an optionally substituted heterocyclyl or optionally substituted heteroaryl moiety rigidly bonded to the tetrahedral bridgehead group, and the [2.2.Z] bridged bicyclic compound has a singlet emission lifetime that is at least about 10 times greater than a singlet emission lifetime of at least one of an isolated A, B, and C group, wherein:

the [2.2.Z] bridged bicyclic compound comprises a structure as Formula (II) or Formula (III):

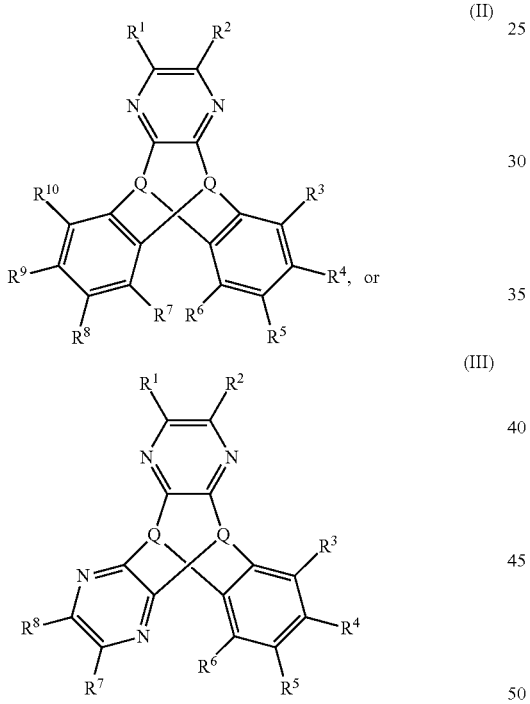

wherein:

each Q is a tetrahedral bridgehead group,

Z is 1 or 2, and $R^1$-$R^{10}$ is the same or different and are hydrogen, halo, hydroxyl, amino, alkyl, heteroalkyl, alkenyl, alkynyl, aryl, heteroaryl, heterocyclyl, or a carbonyl group, any of which is optionally substituted, or, any two adjacent groups of $R^1$-$R^{10}$ is joined together to form an optionally substituted ring, wherein:

two adjacent groups of $R^1$-$R^{10}$ are joined together to form the at least one heterocyclic or heteroaryl group.

2. A composition, comprising:

a [2.2.Z] bridged bicyclic compound comprising a structure as in Formula (I):

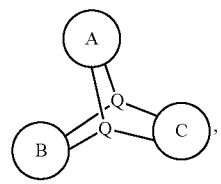

wherein:

each Q is the same or different and a tetrahedral bridgehead group, at least two of A, B, and C are the same or different and include a pi-electron group, Z is 1 or 2, at least one of the pi-electron groups is an electron donating group comprising an optionally substituted carbocyclyl or optionally substituted heteroaryl moiety rigidly bonded to the tetrahedral bridgehead group, at least one of the pi-electron systems is an electron accepting group comprising an optionally substituted heterocyclyl or optionally substituted heteroaryl moiety rigidly bonded to the tetrahedral bridgehead group, and the [2.2.Z] bridged bicyclic compound exhibits an energy gap between a singlet excited state and a triplet excited state in solution or in host matrix of less than about 0.2 eV, wherein:

the [2.2.Z] bridged bicyclic compound comprises a structure as Formula (II) or Formula (III):

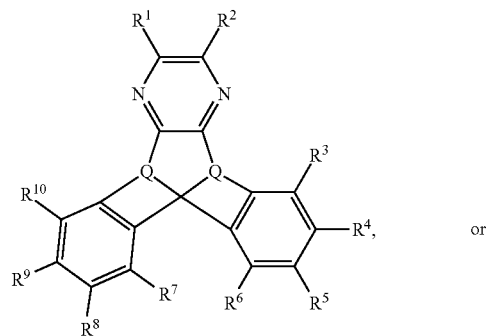

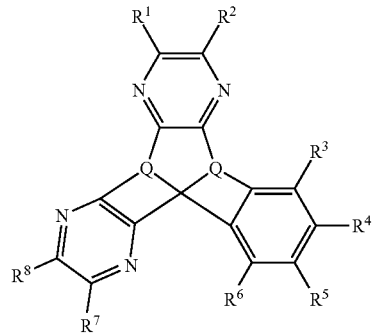

wherein:

each Q is a tetrahedral bridgehead group,

Z is 1 or 2, and $R^1$-$R^{10}$ is the same or different and are hydrogen, halo, hydroxyl, amino, alkyl, heteroalkyl, alkenyl, alkynyl, aryl, heteroaryl, heterocyclyl, or a carbonyl group, any of which is optionally substituted, or, any two adjacent groups of $R^1$-$R^{10}$ is joined together to form an optionally substituted ring, wherein:
two adjacent groups of $R^1$-$R^{10}$ are joined together to form the at least one heterocyclic or heteroaryl group.

3. A composition as in claim 1, wherein the electron donating group is capable of stabilizing positive charge in an excited state.

4. A composition as in claim 1, wherein the [2.2.Z] bridged bicyclic compound comprises a structure as in Formula (IV) or Formula (V):

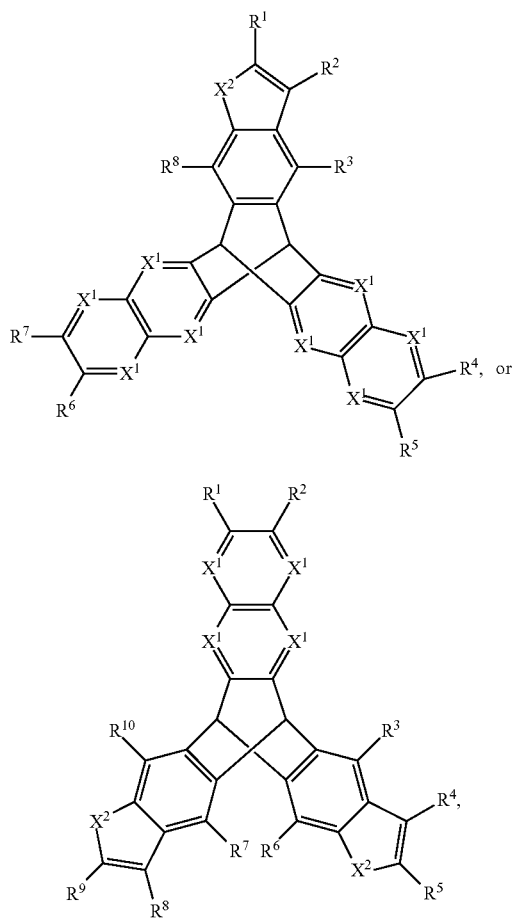

wherein:
Z is 2,
$R^1$-$R^{10}$ is the same or different and are hydrogen, halo, hydroxyl, amino, alkyl, heteroalkyl, alkenyl, alkynyl, aryl, heteroaryl, heterocyclyl, or a carbonyl group, any of which is optionally substituted, or, any two adjacent groups of $R^1$-$R^{10}$ is joined together to form an optionally substituted ring,
each $X^1$ is the same or different and N or CH provided at least 2 of $X^1$ is N, and
each $X^2$ is NR', CR'$_2$, O, or S, wherein R' is H, or Ph.

5. A composition as in claim 4, wherein two adjacent groups of $R^1$-$R^{10}$ are joined together to form the at least one heterocyclic or heteroaryl group.

6. A composition as in claim 1, wherein the [2.2.Z] bridged bicyclic compound comprises a structure as in Formula (VI):

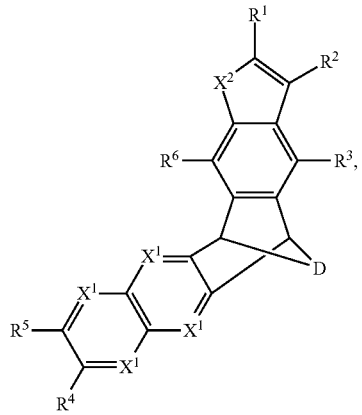

wherein:
Z is 1,
each $R^1$-$R^6$ is the same or different and are hydrogen, halo, hydroxyl, amino, alkyl, heteroalkyl, alkenyl, alkynyl, aryl, heteroaryl, heterocyclyl, or a carbonyl group, any of which is optionally substituted, or, any two adjacent groups of R is joined together to form an optionally substituted ring,
D is O, NR' or CR'$_2$, and
each $X^1$ is the same or different and N or CH provided at least 2 of $X^1$ is N, and
each $X^2$ is NR', CR'$_2$, O, or S, wherein R' is H, or Ph.

7. A composition as in claim 6, wherein two adjacent groups of $R^1$-$R^6$ are joined together to form the at least one heterocyclic or heteroaryl group.

8. A device, comprising:
an electrode; and
an emissive layer comprising the composition of claim 1.

9. A device as in claim 8, wherein the device has an electroluminescence wavelength ranging between about 400 nm and about 480 nm.

10. A device as in claim 8, wherein the device has an external quantum efficiency of at least about 8%.

11. A device as in claim 8, wherein the emissive layer comprises a host matrix.

12. A method for generating light, comprising:
applying an electric potential to an emissive layer, the emissive layer comprising the compound as in claim 1, wherein the wavelength of the generated light is between about 400 nm and about 480 nm.

13. A composition as in claim 1, wherein a contact distance between the electron donating group and the electron accepting group is at least 3.4 angstroms.

14. A composition as in claim 1, wherein the [2.2.Z] bridged bicyclic compound is selected from the group consisting of:

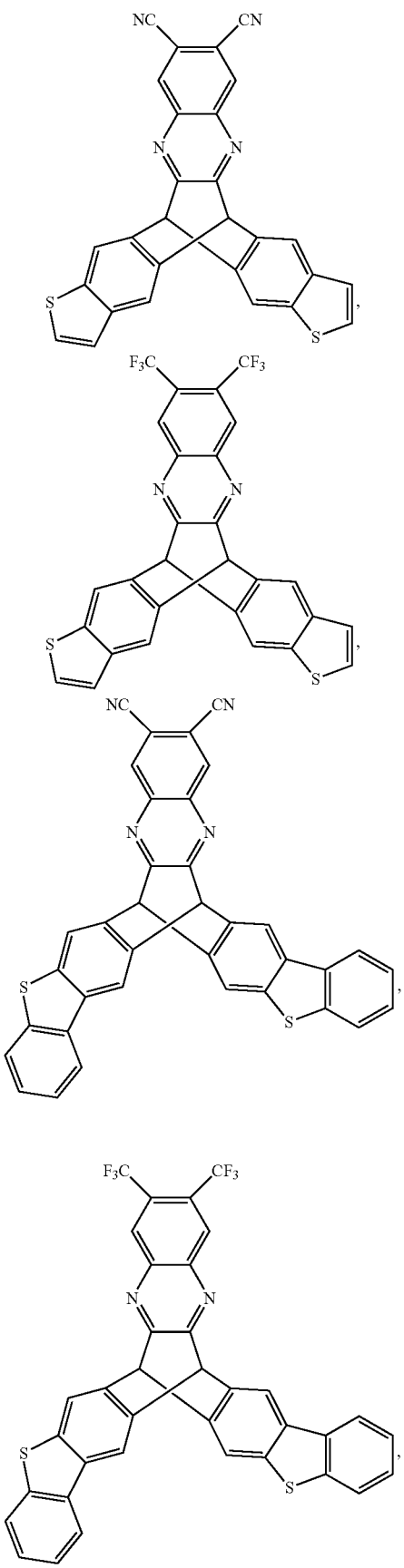

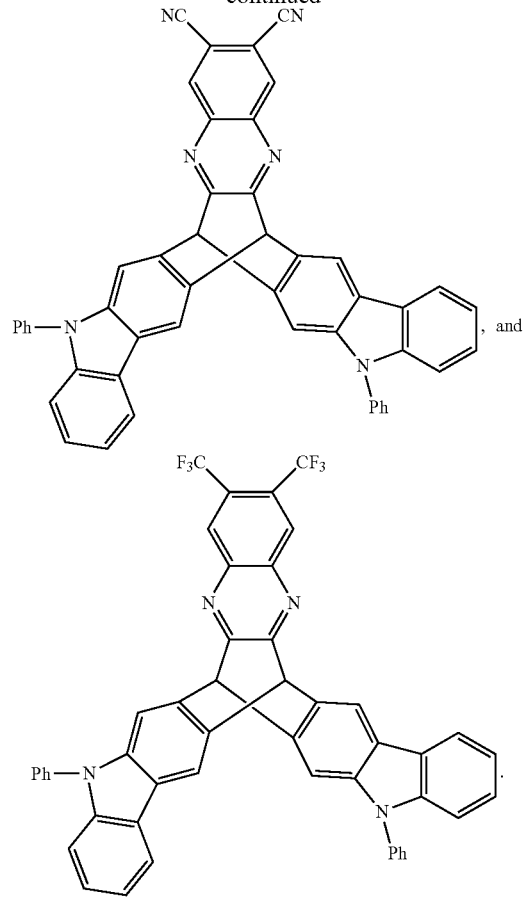

15. A composition, comprising:
a [2.2.Z] bridged bicyclic compound comprising a structure as in Formula (I):

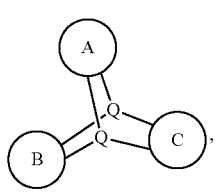

wherein:
each Q is the same or different and a tetrahedral bridgehead group,
at least two of A, B, and C are the same or different and include a pi-electron group,
Z is 1 or 2,
at least one of the pi-electron groups is an electron donating group comprising an optionally substituted carbocyclyl or optionally substituted heteroaryl moiety rigidly bonded to the tetrahedral bridgehead group,
at least one of the pi-electron groups is an electron accepting group comprising an optionally substituted heterocyclyl or optionally substituted heteroaryl moiety rigidly bonded to the tetrahedral bridgehead group, and
the [2.2.Z] bridged bicyclic compound has a singlet emission lifetime that is at least about 10 times greater than a singlet emission lifetime of at least one of an isolated A, B, and C group, wherein
a contact distance between the electron donating group and the electron accepting group is at least 3.4 angstroms.
16. A composition as in claim 15, wherein the [2.2.Z] bridged bicyclic compound is selected from the group consisting of:
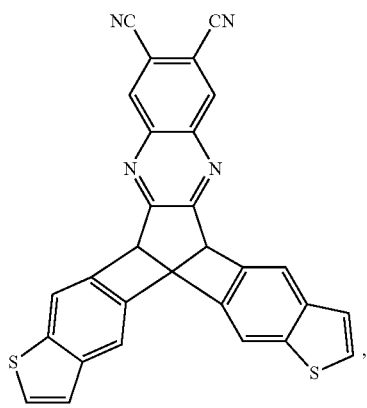
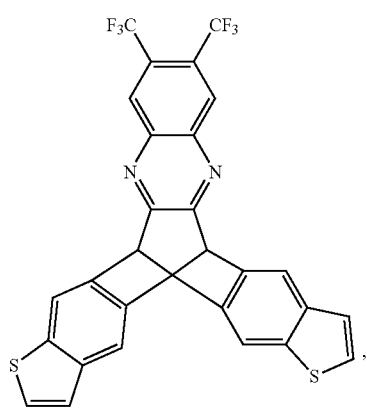
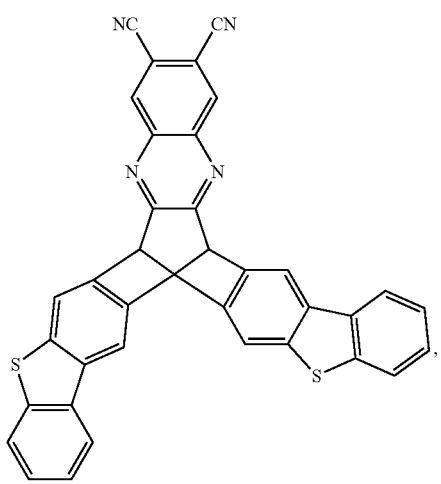
-continued
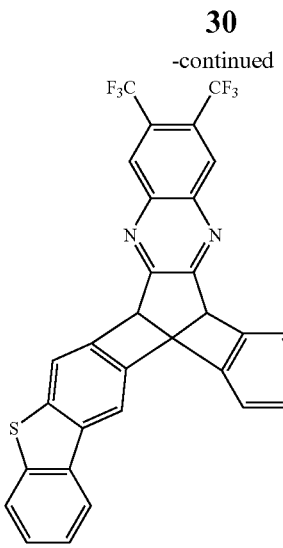
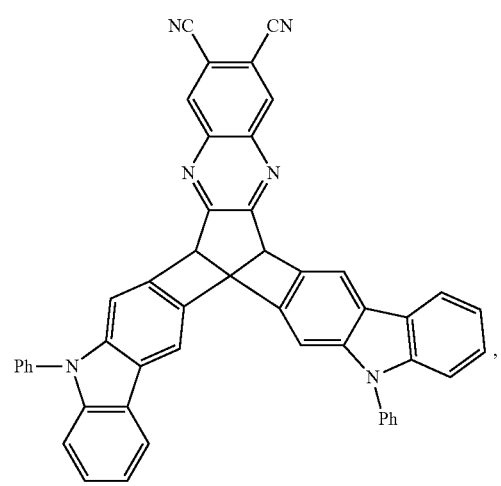
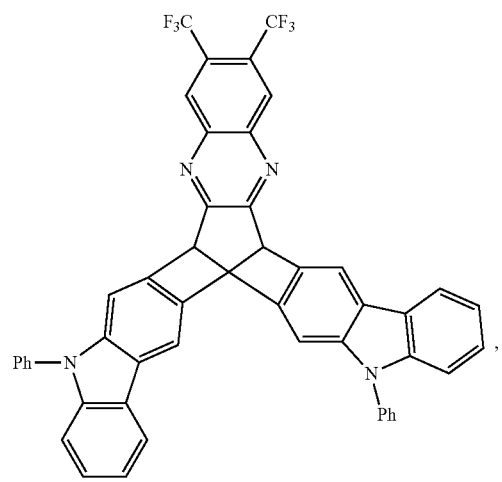

-continued
31
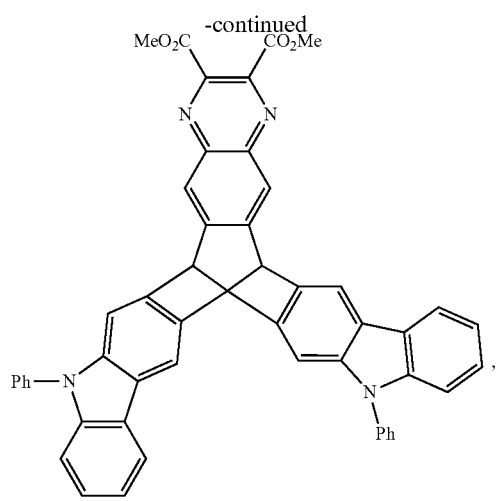
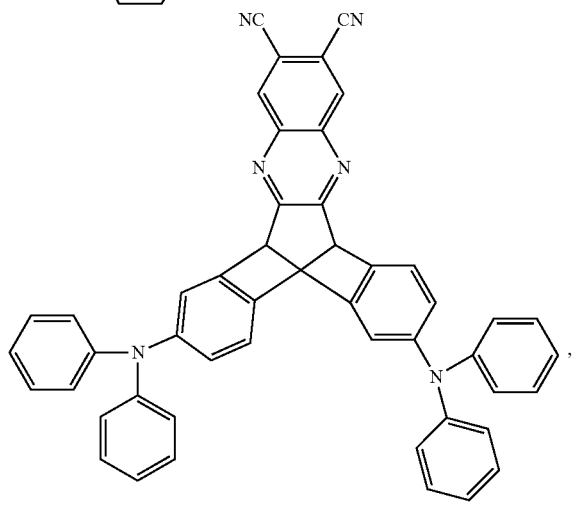
32
-continued
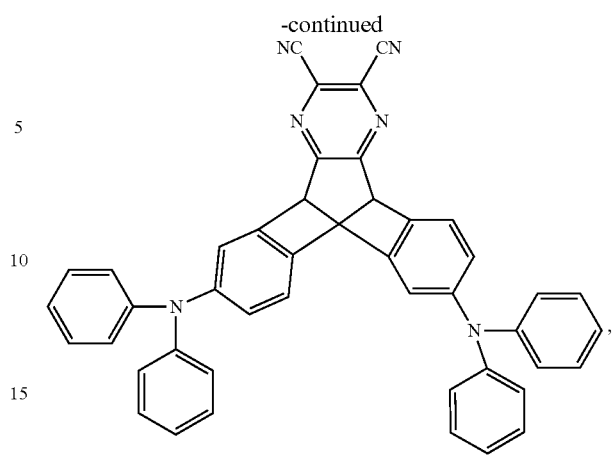
and
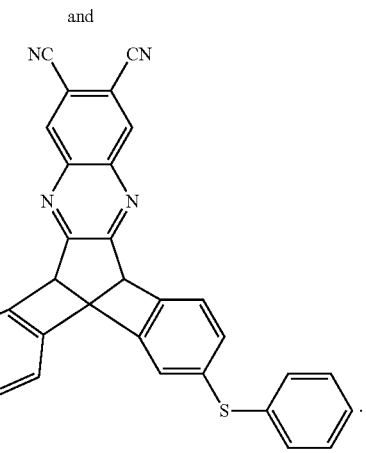
* * * * *